(12) United States Patent
Kikuchi et al.

(10) Patent No.: US 7,880,302 B2
(45) Date of Patent: Feb. 1, 2011

(54) SEMICONDUCTOR DEVICE HAVING METAL WIRINGS OF LAMINATED STRUCTURE

(75) Inventors: Hideaki Kikuchi, Kawasaki (JP); Kouichi Nagai, Kawasaki (JP); Jirou Miura, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 77 days.

(21) Appl. No.: 12/034,962

(22) Filed: Feb. 21, 2008

(65) Prior Publication Data

US 2008/0197502 A1    Aug. 21, 2008

(30) Foreign Application Priority Data

Feb. 21, 2007    (JP) ............... 2007-040325

(51) Int. Cl.
*H01L 23/48* (2006.01)
(52) U.S. Cl. ............... 257/748; 257/E23.145
(58) Field of Classification Search ........... 257/748, 257/751, 758, 774, E23.145
See application file for complete search history.

(56) References Cited

U.S. PATENT DOCUMENTS

| | | | |
|---|---|---|---|
| 5,342,806 A | 8/1994 | Asahina | |
| 5,342,807 A | 8/1994 | Kinsman et al. | |
| 6,794,286 B2 * | 9/2004 | Aoyama et al. | 438/638 |

FOREIGN PATENT DOCUMENTS

| | | |
|---|---|---|
| JP | 02-341 A | 1/1990 |
| JP | 2-341 A | 1/1990 |
| JP | 03-153030 A | 7/1991 |
| JP | 3-153030 A | 7/1991 |

* cited by examiner

*Primary Examiner*—Quoc D Hoang
(74) *Attorney, Agent, or Firm*—Westerman, Hattori, Daniels & Adrian, LLP

(57) ABSTRACT

A semiconductor device that includes a metal wiring formed on the insulating film and having a main wiring portion laminated with a plurality of metal films and a metal protection film formed at least on the upper surfaces of the main wiring portion and made of a precious metal material.

7 Claims, 32 Drawing Sheets

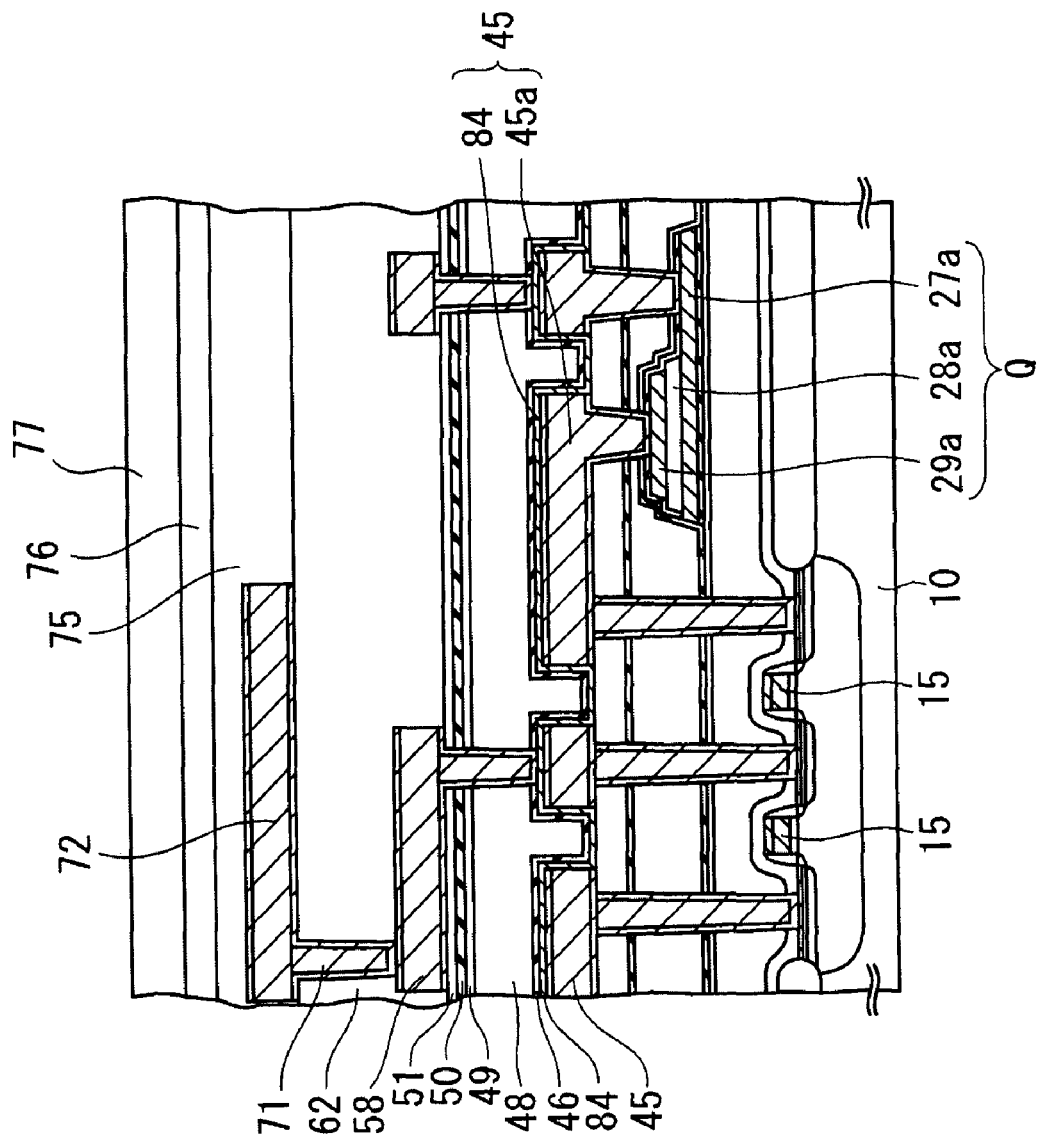

US 7,880,302 B2

SEMICONDUCTOR DEVICE HAVING METAL WIRINGS OF LAMINATED STRUCTURE

CROSS-REFERENCE TO RELATED APPLICATIONS

This application is based upon and claims the benefit of priority from the prior Japanese Patent Application No. 2007-40325, filed on Feb. 21, 2007, the entire contents of which are incorporated herein by reference.

TECHNICAL FIELD

The present invention relates to a semiconductor device having a wiring structure applicable to the wiring technology of electronic devices, including logic LSIs and memory LSIs, and to a method of manufacturing the semiconductor device.

BACKGROUND

In a semiconductor device, such as a logic LSI or a memory LSI, basic components, including transistors, diodes, capacitors and resistors, laid out in an electrically isolated manner are first formed on a semiconductor substrate, and then the components are interconnected by wirings.

Such a technique to interconnect elements as described above, i.e., a multilayer interconnection technique, is a crucial technique that dictates the enhancement of LSI performance. As one example of a method for forming multilayer wirings, there is the following method: first, a metal film made of an aluminum (Al) alloy is formed on an insulating film using a sputtering method. Then, a wiring pattern is formed by patterning the metal film by means of photolithography and dry etching. After that, an interlayer insulating film is formed on the wiring pattern using a CVD method and the interlayer insulating film is processed by means of photolithography and dry etching. As the result of this processing, there are formed via holes deep enough to reach the wiring pattern.

In addition, the entire surface of the semiconductor device is covered with tungsten (W) using a CVD method, so as to fill the via holes. After forming such blanket tungsten (hereinafter referred to as blanket W), the blanket W is etched back so that W plugs are buried in the via holes. Then, a wiring pattern is formed on the interlayer insulating film. This wiring pattern is connected to the lower wiring pattern through the W plugs within the via holes. By repeating such a process as described above, it is possible to form desired multilayer interconnections.

Japanese Patent Application Laid-Open No. Hei 02-341 describes a configuration wherein a plated layer, such as a nickel (Ni) layer, a copper (Cu) layer, a tin (Sn) layer or a gold (Au) layer, is coated on the surfaces of Al wirings or titanium nitride (TiN) wirings by means of nonelectrolytic plating when forming the wirings of a semiconductor device, thereby improving wiring reliability.

In addition, Japanese Patent Application Laid-Open No. Hei 03-153030 describes the following method as a method for forming the wirings of a semiconductor device. First, an Au, Ti, TiN or Ti film is formed using a sputtering method and a resist pattern is formed thereon. Next, after forming Au wirings in the openings of the resist pattern by means of electrolytic plating, the resist pattern is separated off and an underlying layer is removed using the Au wirings as a mask.

In recent years, there have often been adopted laminated wirings having a structure wherein cap metal films made of a different metal material are formed on Al alloy films for the purpose of, for example, improving electromigration resistance characteristics. When adopting such wirings having a laminated structure (hereinafter referred to as laminated wirings) as described above, there may arise a problem in a step of forming via holes. This problem arises in the following mechanism: first, an interlayer insulating film covering the wirings is processed by means of dry etching using a fluorine-based gas, to form via holes reaching to the wirings. At this time, there is a case that a foreign substance (reaction product) remains on the sidewalls of the via holes at the time of overetching the via holes, depending on a material composing the cap metal films of laminated wirings. This foreign substance cannot be removed in a step of resist separation (dry ashing and wet treatment). As a result, such a problem as contact failure occurs, thereby possibly degrading the yield of multilayer interconnections.

As described above, the related art has had the problem that it is not possible to form reliable multilayer interconnections since a problem can easily occur when forming via holes in a case where the wirings of a laminated structure are used.

SUMMARY

The present invention is directed to various embodiments of a semiconductor device that includes a metal wiring formed on the insulating film and having a main wiring portion laminated with a plurality of metal films and a metal protection film formed at least on the upper surfaces of the main wiring portions and made of a precious metal material.

DETAILED DESCRIPTION OF THE EMBODIMENTS

Hereinafter, embodiments of the present invention will be described with reference to the accompanying drawings.

Figure 1A:
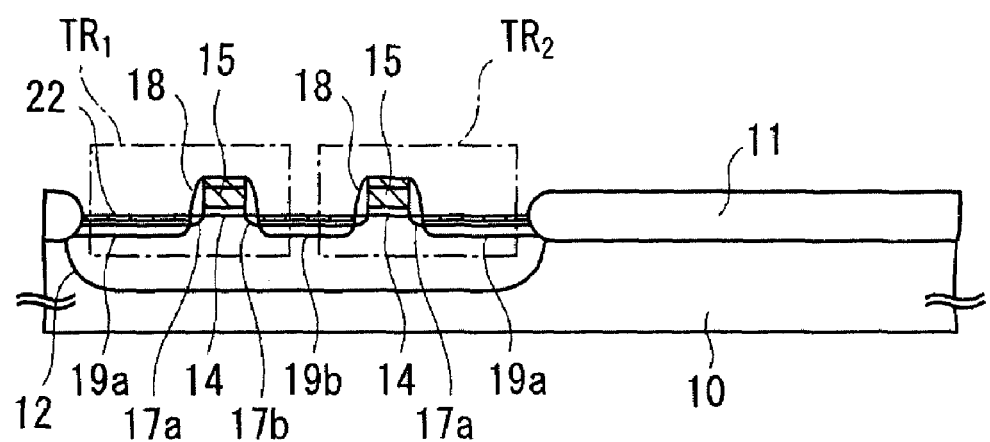
FIGS. 1A to 1AH are cross-sectional views illustrating a method of manufacturing a semiconductor device in accordance with an embodiment of the present invention.

FIGS. 1A to 1AH are cross-sectional views illustrating a method of manufacturing a semiconductor device in accordance with a first embodiment of the present invention. Note that in the present embodiment, the description will be made by taking an FeRAM as an example of the semiconductor device.

First, an explanation will be made of steps taken until the cross-section structure shown in FIG. 1A is obtained. The illustrated region is the cell region of the FeRAM.

First, an element-isolating insulating film 11 is formed by thermally oxidizing the surface of an n-type or p-type silicon (semiconductor) substrate 10. This element-isolating insulating film 11 defines the active region of a transistor. The thickness of the element-isolating insulating film 11 is, for example, approximately 200 nm when measured from the upper surface of the silicon substrate 10. While such an element isolation structure is referred to as local oxidation of silicon (LOCOS), shallow trench isolation (STI) may be adopted instead.

Next, a p-type impurity, for example, boron is introduced to form a p-well 12 in the active region of the silicon substrate 10. Then, the surface of the active region is thermally oxidized to form thermally-oxidized films to be serving as gate-insulating films 14 to a thickness of approximately 6 nm to 7 nm.

Next, an approximately 50 nm thick amorphous silicon film and an approximately 150 nm thick tungsten silicide film are sequentially formed on the entire upper surface of the silicon substrate 10. Note that a polysilicon film may be formed in place of the amorphous silicon film. Then, these films are patterned by means of photolithography to form gate electrodes 15 on the silicon substrate 10. The gate length of the gate electrodes 15 is, for example, approximately 360 nm.

In addition, source/drain extensions 17a and 17b are formed by introducing phosphorous as an n-type impurity to the silicon substrate 10 beside each gate electrode 15 by means of ion implantation using the gate electrodes 15 as masks.

After that, an insulating film is formed on the entire upper surface of the silicon substrate 10. The insulating film is etched back so that it remains as insulating spacers 18 beside each gate electrode 15. As the insulating film, a silicon dioxide film is formed to a thickness of 45 nm using, for example, a CVD method.

Then, an n-type impurity, such as arsenide, is once again ion-implanted into the silicon substrate 10 using these insulating spacers 18 and the gate electrodes 15 as masks, in order to form source/drain regions (impurity-diffused regions) 19a and 19b on the silicon substrate 10 beside each gate electrode 15.

In addition, a high-melting point metal film, such as a cobalt film, is formed on the entire upper surface of the silicon substrate 10 using a sputtering method. Then, the high-melting point metal film is heated to react with silicon, to form high-melting point silicide layers 22, such as cobalt silicide layers, on the silicon substrate 10 in the source/drain regions 19a and 19b, thereby reducing the resistance of the respective source/drain regions 19a and 19b. Note that such high-melting point metal silicide layers are also formed on the surface layers of the gate electrodes 15.

After that, high-melting point metal layers remaining unreacted on the element-isolating insulating film 11 or the like are wet-etched and thus removed.

As the result of steps up to this point, there are formed a first MOS transistor TR1 and a second MOS transistor TR2 composed of the gate-insulating films 14, the gate electrodes 15, the source/drain regions 19a and 19b, and the like in the cell region of the silicon substrate 10.

Figure 1B:
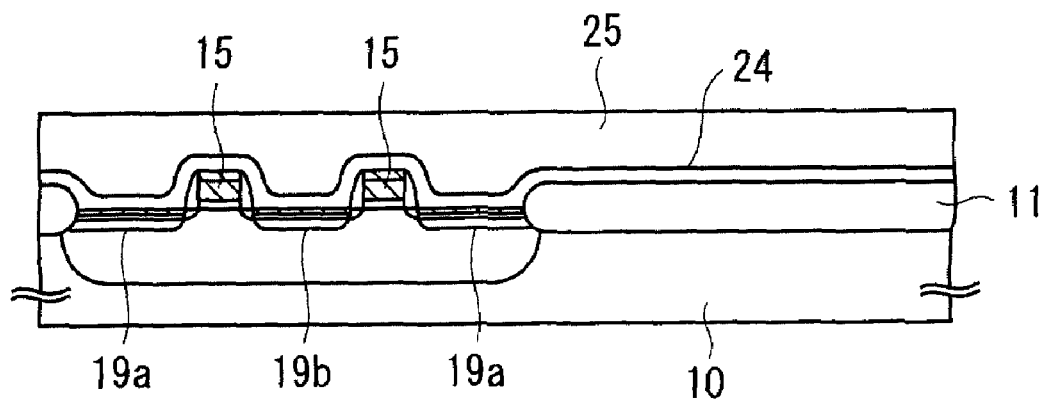

Next, as shown in FIG. 1B, a silicon oxynitride (SiON) film is formed on the entire upper surface of the silicon substrate 10 to a thickness of approximately 200 nm using a plasma CVD method, and the SiON film is defined as an etching stopper film 24.

In addition, a silicon dioxide ($SiO_2$) film is formed as an underlying insulating film 25 on this etching stopper film 24 to a thickness of, for example, 600 nm using a plasma CVD method making use of a mixed gas composed of a tetraethoxysilane (TEOS) gas and an oxygen gas. Then, the upper surface of the underlying insulating film 25 is polished by means of chemical-mechanical polishing (CMP), in order to planarize the upper surface. The amount of polish is, for example, approximately 200 nm.

Figure 1C:
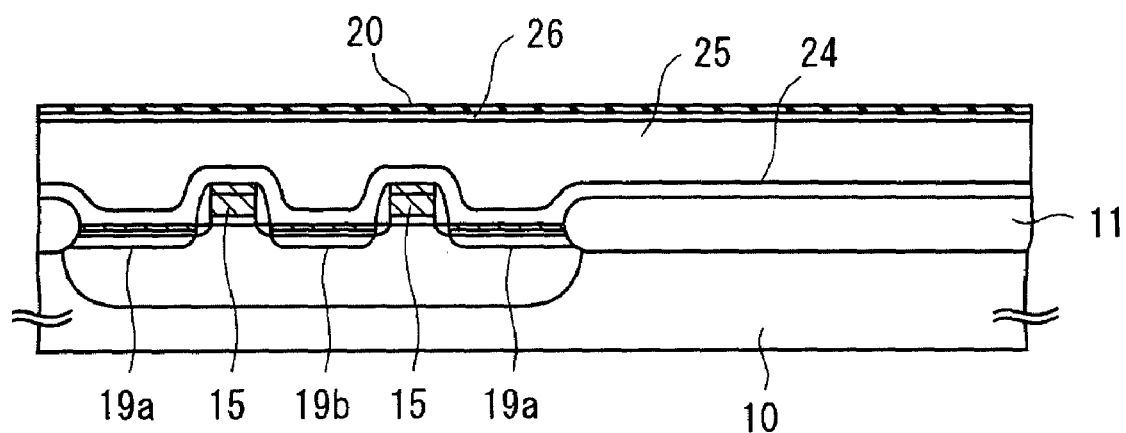

Next, as shown in FIG. 1C, a silicon dioxide film is once again formed on this underlying insulating film 25 using a plasma CVD method with a TEOS gas to a thickness of, for example, approximately 100 nm, so that this silicon dioxide film serves as a first cap insulating layer 26.

Then, after carrying out annealing for approximately 30 minutes at a substrate temperature of approximately 650° C. in a nitrogen atmosphere, for example, as the dehydration treatment of these insulating films 25 and 26, an alumina film 20 is formed on the cap insulating layer 26 using a sputtering method to a thickness of approximately 20 nm.

After that, rapid thermal anneal (RTA) is performed on this alumina film 20 at a substrate temperature of 650° C. for a treating time of 60 seconds.

As the result of forming the first cap insulating layer 26 in this way, microscopic scratches (micro-scratches) on the upper surface of the underlying insulating film 25 caused by the contact of the surface with a polishing pad in the above-described CMP are buried in the first cap insulating layer 26. Thus, the alumina film 20 is formed on the upper surface of the first cap insulating layer 26 with excellent planarity.

Figure 1D:
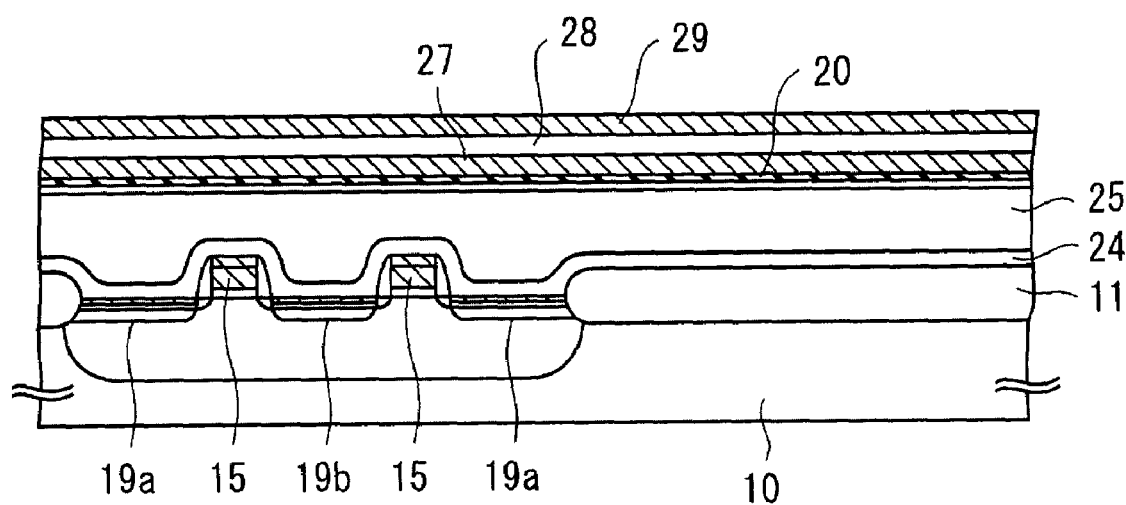

Next, an explanation will be made of steps taken until the cross-section structure shown in FIG. 1D is obtained.

First, a platinum film is formed on the alumina film 20 as a first conductive film 27 using a sputtering method. This first conductive film 27 is patterned in a subsequent step to form a capacitor lower electrode. Note that the thickness of the first conductive film 27 is, for example, approximately 155 nm.

In addition, a lead zirconate titanate (PbZr1-xTixO3) film, i.e., a PZT film is formed on the first conductive film 27 using, for example, a sputtering method, to a thickness of 150 to 200 nm. Then, this PZT film is defined as a ferroelectric film 28.

Note that a metal organic CVD (MOCVD) method or a sol-gel method is also adoptable, in addition to a sputtering method, as a method of forming the ferroelectric film 28. In addition, the material of the ferroelectric film 28 is not limited to the abovementioned PZT; the ferroelectric film 28 may be composed of a Bi layer-structure compound, such as $SrBi_2Ta_2O_9$ (SBT), $SrBi_2$ $(Ta_xNb1-x)_2O_9$ or $Bi_4Ti_2O_{12}$, of $Pb_{1-x}La_xZr_{1-y}Ti_yO_3$ (PLZT) formed by doping PZT with lanthanum, or of another ferroelectric metal oxide.

It should be noted here that PZT formed using a sputtering method is hardly crystallized immediately after being film-formed and, therefore, lacks ferroelectric properties. Hence, as crystallization anneal for the purpose of crystallizing PZT composing the ferroelectric film 28, rapid thermal anneal (RTA) is performed for approximately 90 seconds at a substrate temperature of approximately 585° C. in an oxygen-containing atmosphere with an oxygen flow rate of 0.025 liter/min. Note that this crystallization anneal is not required if the ferroelectric film 28 is formed using an MOCVD method.

Next, a first iridium dioxide ($IrO_2$) film is formed on the above-described ferroelectric film 28 to a thickness of approximately 50 nm using a sputtering method, and RTA is performed on this first iridium oxide film. While the conditions of this RTA are not restricted in particular, it is assumed in the present embodiment that the RTA is performed in an oxygen-containing atmosphere with an oxygen flow rate of 0.025 liter/min and the substrate temperature and the treating time at this time are specified as 725° C. and 20 seconds, respectively.

After that, a second iridium oxide film is formed on the first iridium oxide film to a thickness of approximately 200 nm using a sputtering method. A laminated film composed of the first iridium oxide film and the second iridium oxide film serves as a second conductive film 29.

It should be noted here that since the first conductive film 27 is formed on the alumina film 20, there is obtained an excellent orientation of platinum composing the first conductive film 27, compared with a case wherein the alumina film 20 is omitted and the first conductive film 27 is directly formed on the cap insulating layer 26. Due to the effect of this orientation of the first conductive film 27, the orientation of the PZT composing the ferroelectric film 28 becomes well aligned, thereby improving the ferroelectric properties of the ferroelectric film 28.

Figure 1E:
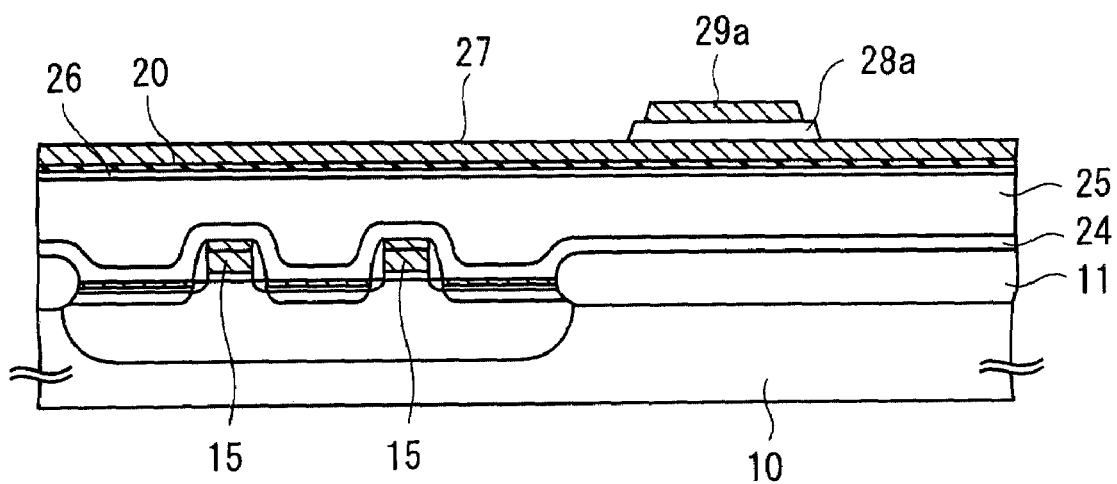

Next, an explanation will be made of steps taken until the cross-section structure shown in FIG. 1E is obtained.

First, the second conductive film 29 is patterned by means of photolithography to form an upper electrode 29a. Then, a recovery anneal is performed on the ferroelectric film 28 within a vertical furnace, in order to recover the ferroelectric film 28 from damage it has suffered due to this patterning. This recovery anneal is performed in an oxygen-containing atmosphere with an oxygen flow rate of 20 liter/min, wherein the conditions of this anneal are specified as, for example, a substrate temperature of 650° C. and a treating time of 60 minutes.

Next, the ferroelectric film 28 is patterned by means of photolithography to form a capacitor dielectric film 28a composed of PZT or the like. The capacitor dielectric film 28a is recovered from damage it has suffered due to this patterning by performing a recovery anneal. This recovery anneal is performed in an oxygen-containing atmosphere using a vertical furnace, wherein an oxygen flow rate of 20 liter/min, a substrate temperature of 350° C., and a treating time of 60 minutes are adopted as the conditions of this anneal.

Figure 1F:
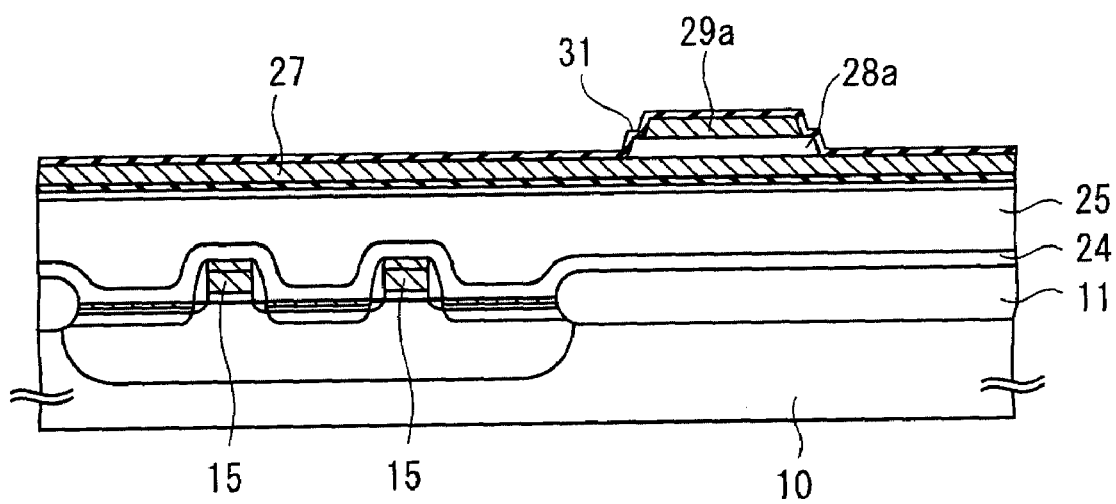

Next, as shown in FIG. 1F, an alumina film is formed on the entire upper surface of the silicon substrate 10 to a thickness of approximately 50 nm using a sputtering method. This alumina film functions as a first capacitor protection insulating film 31 intended to protect the capacitor dielectric film 28a from reducing substances, such as hydrogen and moisture.

Note that either one of a titanium oxide ($TiO_x$) film, a zirconium oxide ($ZrO_x$) film, a magnesium oxide ($MgO_x$) film, and a titanium magnesium oxide ($MgTiO_x$) film may be formed in place of the alumina film as the first capacitor protection insulating film 31.

Then, a recovery anneal is performed for approximately 60 minutes at a substrate temperature of 550° C. in an oxygen-containing atmosphere with an oxygen flow rate of 20 liter/min, in order to recover the capacitor dielectric film 28a from damage it has suffered due to this sputtering. This recovery anneal is performed within a vertical furnace.

Figure 1G:
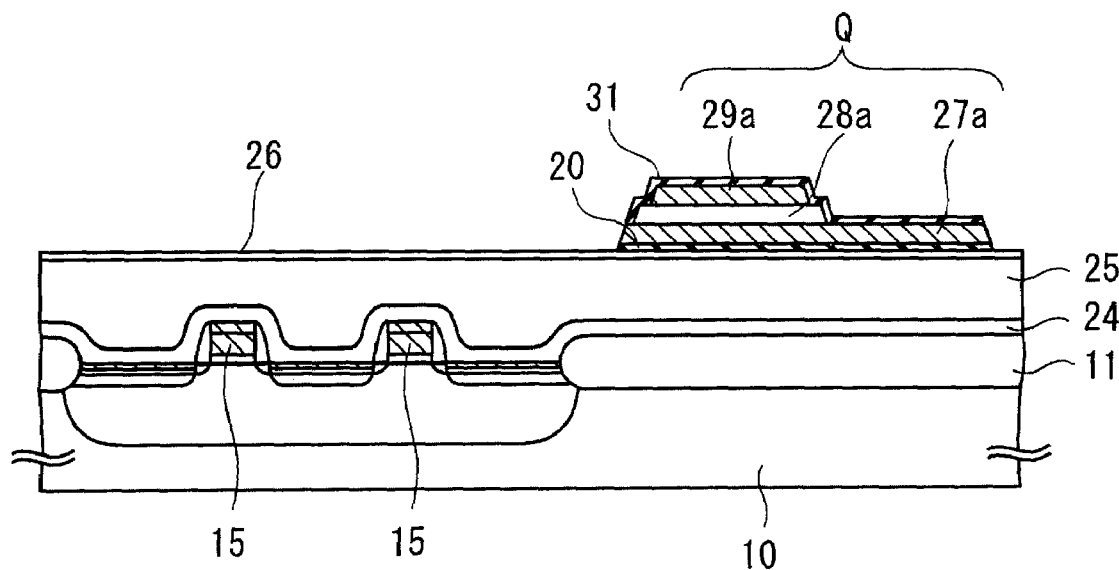

Next, as shown in FIG. 1G, the first conductive film 27 and the first capacitor protection insulating film 31 are patterned by means of photolithography, in order to shape the first conductive film 27 below the capacitor dielectric film 28a into a lower electrode 27a and to leave the first capacitor protection insulating film 31 so as to cover this lower electrode 27a.

After that, a recovery anneal is performed on the capacitor dielectric film 28a on the condition of a substrate temperature of 650° C. and a treating time of 60 minutes in an oxygen-containing atmosphere with an oxygen flow rate of 20 liter/min, in order to recover the capacitor dielectric film 28a from damage it has suffered during processing. This recovery anneal is performed using, for example, a vertical furnace.

As the result of steps up to this point, there is formed, above the silicon substrate 10, a capacitor Q composed of the lower electrode 27a, the capacitor dielectric film 28a and the upper electrode 29a laminated in this order.

Figure 1H:
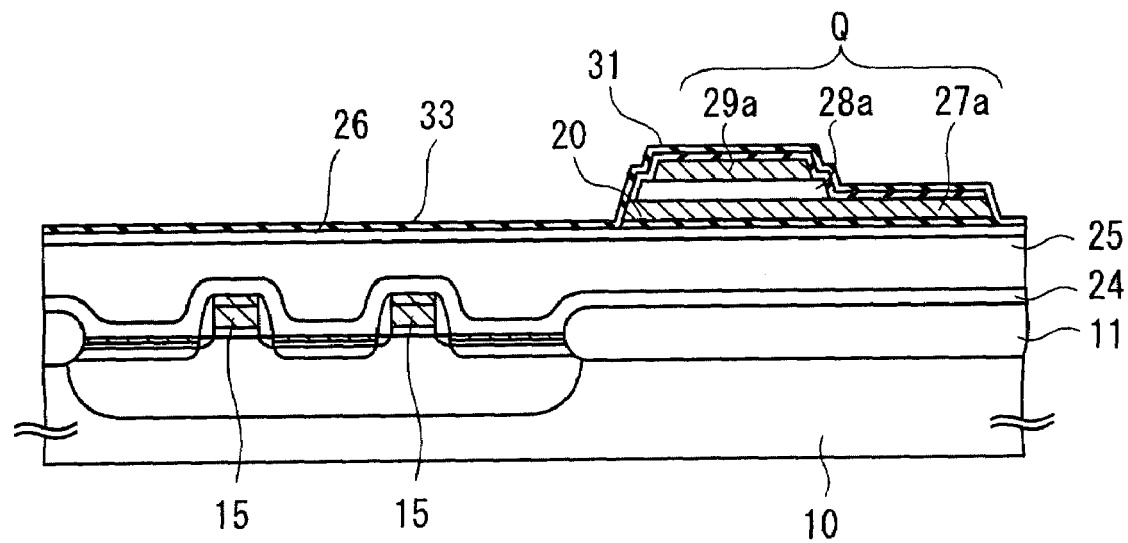

Then, as shown in FIG. 1H, an alumina film is formed on the entire upper surface of the silicon substrate 10 to a thickness of approximately 20 nm using, for example, a sputtering method. The alumina film functions as a second capacitor protection insulating film 33 intended to protect the capacitor Q. This second capacitor protection insulating film 33, in conjunction with the first capacitor protection insulating film 31 positioned thereunder, prevents reducing substances, such as hydrogen and moisture, from reaching to the capacitor dielectric film 28a. In addition, the second capacitor protection insulating film 33 functions so as to inhibit the capacitor dielectric film 28a from being reduced and thereby the ferroelectric properties thereof from being degraded.

Films having such a function as described above include a titanium oxide film, a zirconium oxide film, a magnesium oxide film and a titanium magnesium oxide film, in addition to the alumina film. Either one of these films may be formed as the second capacitor protection insulating film 33.

Then, a recovery anneal is performed on the capacitor dielectric film 28a within a vertical furnace placed in an oxygen-containing atmosphere, on the condition of a substrate temperature of 550° C. and a treating time of 60 minutes. An oxygen flow rate in this recovery anneal is, for example, 20 liter/min.

Figure 1I:
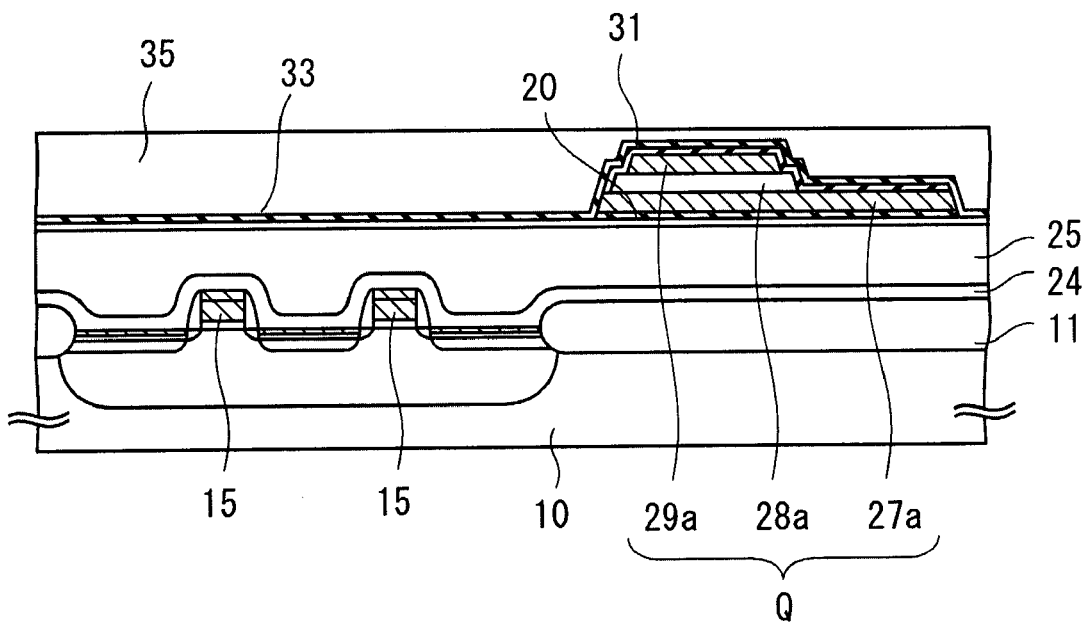

Next, as shown in FIG. 1I, a silicon dioxide film is formed on the abovementioned second capacitor protection insulating film 33 to a thickness of approximately 1500 nm using a plasma CVD method making use of a TEOS gas. This silicon dioxide film is defined as a first interlayer insulating film 35.

After that, an $N_2O$ plasma treatment (heat treatment) making use of a CVD apparatus is performed as a dehydration treatment on the first interlayer insulating film 35. In this case, the substrate temperature is set to 350° C. and the treating time to 2 minutes. With such an $N_2O$ plasma treatment as described above, it is possible to dehydrate the first interlayer insulating film 35 and nitride the upper surface thereof, thereby preventing the insulating film from readsorbing moisture.

Figure 1J:
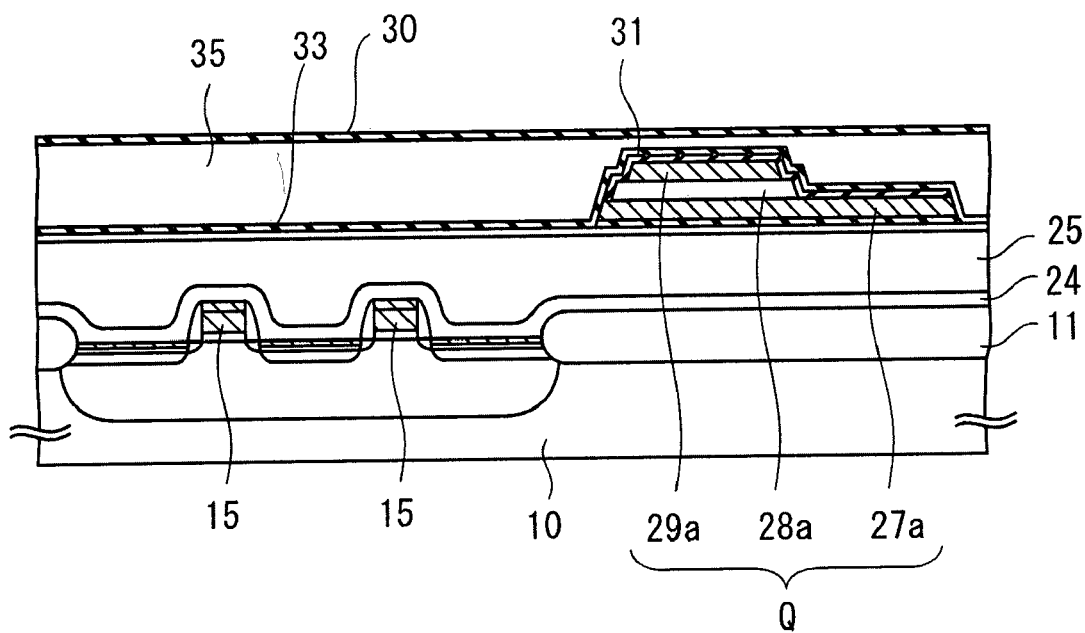

Next, as shown in FIG. 1J, an alumina film is formed on the first interlayer insulating film 35 to a thickness of 50 to 100 nm using a sputtering method. This alumina film is defined as a third capacitor protection insulating film 30. This third capacitor protection insulating film 30 is composed of alumina having excellent blocking properties against moisture and hydrogen. Thus the third capacitor protection insulating film 30 assumes the role of preventing the capacitor dielectric film 28a from being deteriorated by reducing substances, such as moisture and hydrogen.

Note that a film having blocking properties against moisture and hydrogen, for example, either one of a titanium oxide film, a zirconium oxide film, a magnesium oxide film and a titanium magnesium oxide film may be formed in place of the alumina film, as the third capacitor protection insulating film 30.

Figure 1K:
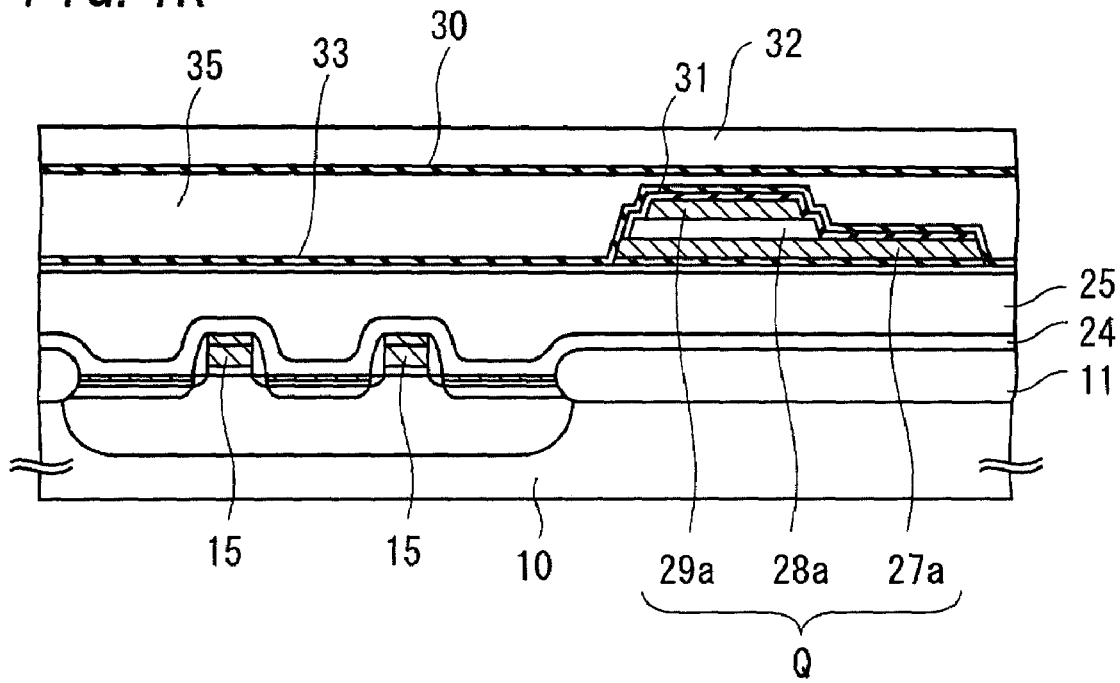

After that, as shown FIG. 1K, a silicon dioxide film is formed to a thickness of approximately 200 to 300 nm as a second cap insulating layer 32, using a plasma CVD method making use of a TEOS gas.

Figure 1L:
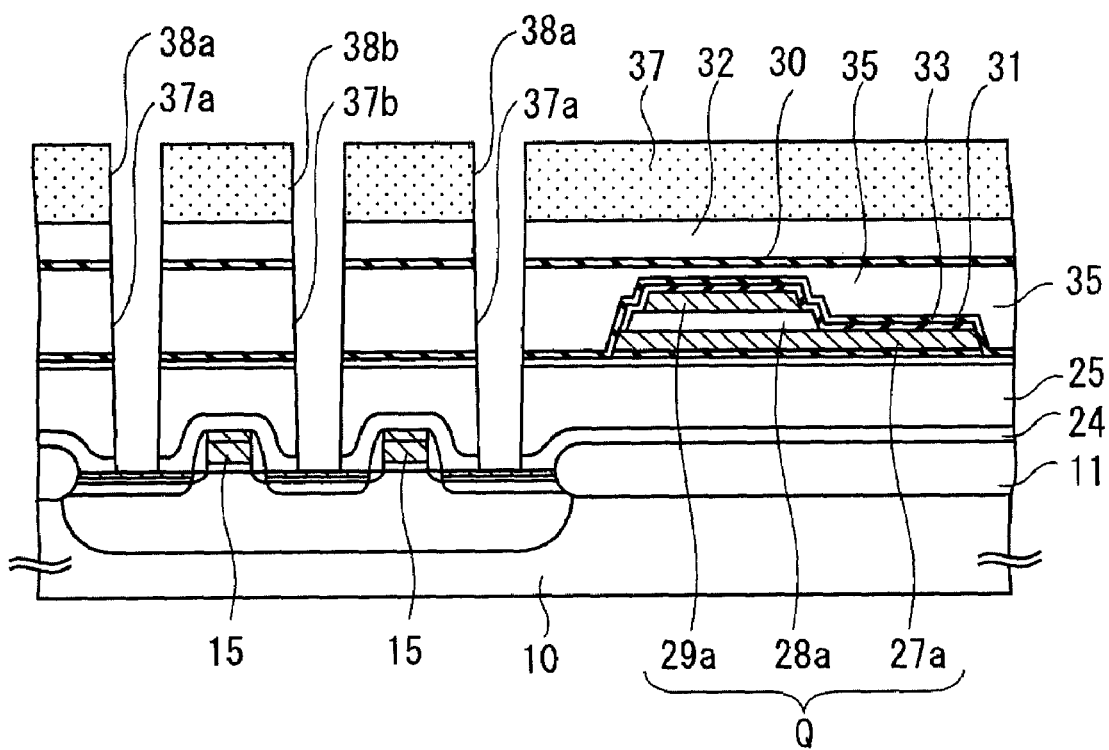

Next, an explanation will be made of steps taken until the cross-section structure shown in FIG. 1L is obtained.

First, a photoresist is applied onto the second cap insulating layer 32 and exposed and developed, so as to form a first resist pattern 37 provided with hole-shaped windows 37a and 37b.

Next, dry etching is applied across an area from the second cap insulating layer 32 to the etching stopper film 24 using this first resist pattern 37 as a mask. As the result of this dry etching, first contact holes 38a and a second contact hole 38b are formed in these insulating films (from the second cap insulating layer 32 to the etching stopper film 24) present under the windows 37a and 37b.

This dry etching is performed in a parallel plate type plasma etching apparatus (not shown in the figure) as three-step etching. In a first step of this etching, an area from the second cap insulating layer 32 to the underlying insulating film 25 is etched using a mixed gas composed of $C_4F_8$, $O_2$+CO, and Ar as an etching gas. This etching stops on the etching stopper film 24 and the etching stopper film 24 is not etched.

In a second step, an etching product produced within the holes in the first step is removed by using a mixed gas composed of $O_2$ and Ar as an etching gas and taking advantage of the sputtering effect of these gases.

In a third step of etching, the etching stopper film 24 is etched using a mixed gas composed of $C_4F_8$, $CHF_3$, $O_2$ and Ar as an etching gas.

At the completion of the etching described above, the first resist pattern 37 is removed.

Figure 1M:
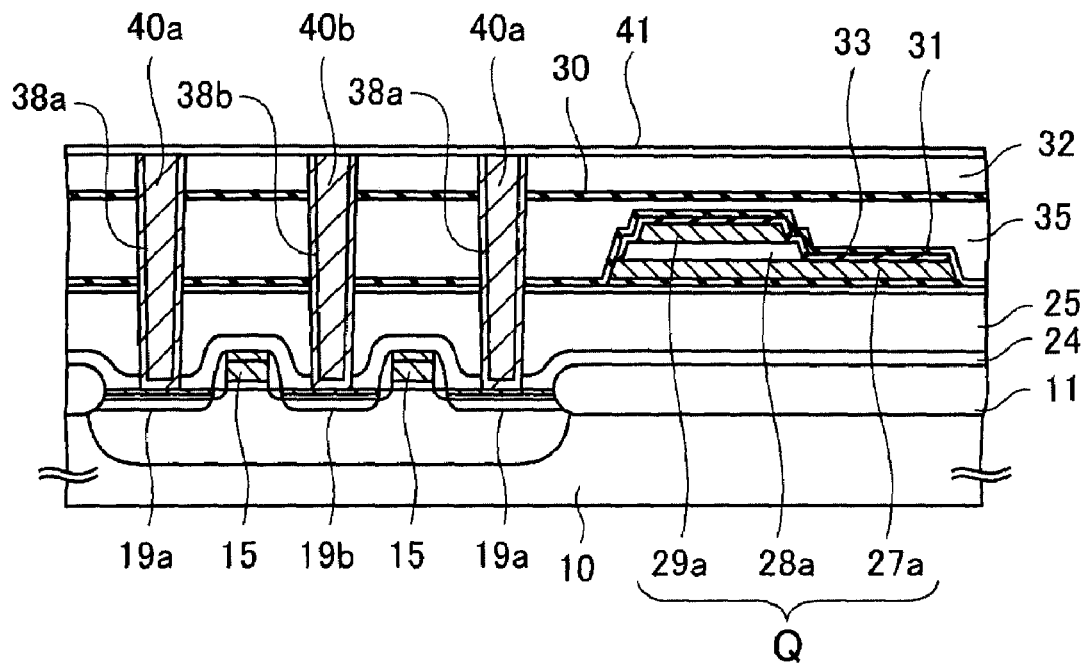

Next, an explanation will be made of steps taken until the cross-section structure shown in FIG. 1M is obtained.

First, a titanium (Ti) film and a titanium nitride (TiN) film are formed on the inner surfaces of the first contact holes 38a and the second contact hole 38b and on the upper surface of the second cap insulating layer 32 to thicknesses of 20 nm and 50 nm, respectively, using a sputtering method. These films are defined as adhesion films (hereinafter referred to as glue films). Then, a tungsten film is formed on these glue films to a thickness of 500 nm using a CVD method with a tungsten hexafluoride gas, so as to completely bury the first contact holes 38a and the second contact hole 38b with this tungsten film.

After that, superfluous glue films and tungsten films on the second cap insulating layer 32 are polished and removed using a CMP method, so as to leave over these films within the first and second contact holes 38a and 38b as first and second conductive plugs 40a and 40b, respectively.

The first and second conductive plugs 40a and 40b are electrically connected to first and second source/drain regions 19a and 19b, respectively.

Note that an $N_2O$ plasma treatment making use of a CVD apparatus may be performed on the second cap insulating layer 32 after forming the first and second conductive plugs 40a and 40b, so as to dehydrate and prevent the second cap insulating layer 32 from readsorbing moisture. This dehydration treatment is performed on the condition of, for example, a substrate temperature of 350° C. and a treating time of 2 minutes.

Incidentally, the first conductive plugs 40a and the second conductive plug 40b may be readily oxidized in an oxygen-containing atmosphere and may therefore cause a contact failure since they are composed primarily of extremely easily oxidized tungsten. Hence, a silicon oxynitride film is formed as an oxidation-preventing insulating film 41 on the upper surfaces of these plugs and on the second cap insulating layer 32 to a thickness of approximately 100 nm using a CVD method, in order to prevent the first conductive plugs 40a and the second conductive plug 40b from being oxidized.

Figure 1N:
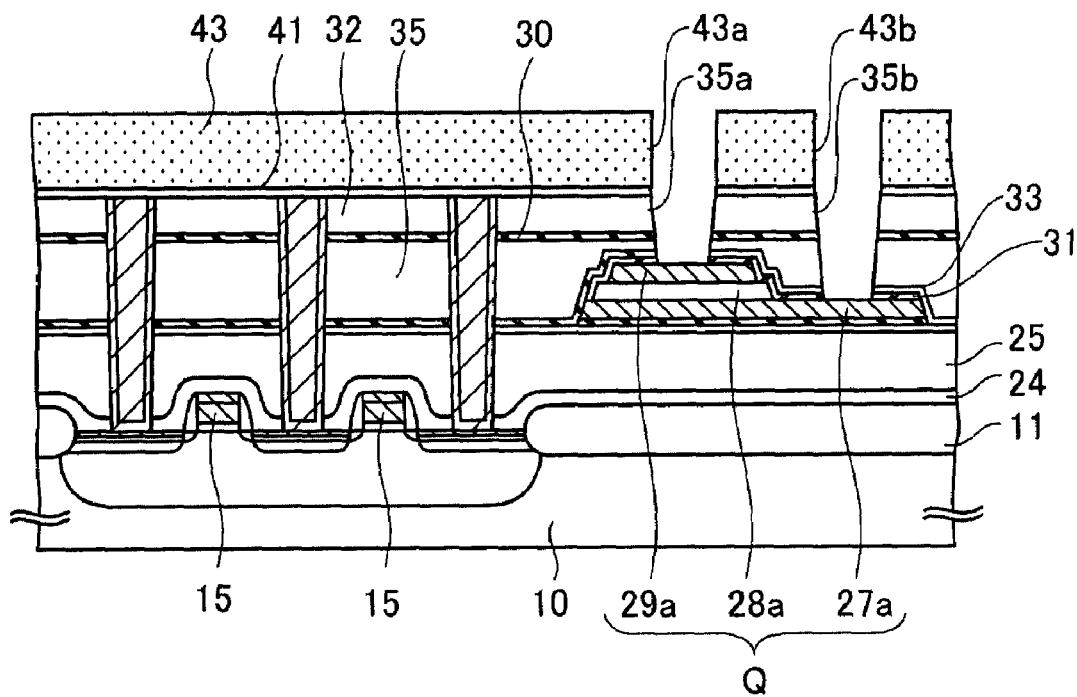

Next, an explanation will be made of steps taken until the cross-section structure shown in FIG. 1N is obtained.

First, a photoresist is applied onto the oxidation-preventing insulating film 41 and is exposed and developed, so as to form a second resist pattern 43. As shown in the figure, hole-shaped windows 43a and 43b are formed on the second resist pattern 43 above the upper electrode 29a and the lower electrode 27a, respectively.

Next, the oxidation-preventing insulating film 41, the second cap insulating layer 32, the first interlayer insulating film 35 and the first to third capacitor protection insulating films 31, 33 and 30 are etched using the second resist pattern 43 as a mask. Then, a first via hole 35a is formed on the upper electrode 29a and a second via hole 35b is formed above the contact region of a lower electrode 27a by means of this etching.

After removing the second resist pattern 43, a recovery anneal is performed on the capacitor dielectric film 28a, in order to recover the capacitor dielectric film 28a from damage it has suffered in steps up to this point. Specifically, the silicon substrate 10 is loaded in a vertical furnace placed in an oxygen-containing atmosphere, and a recovery anneal is performed on the capacitor dielectric film 28a on the condition of a substrate temperature of 500° C. and a treating time of 60 minutes. At this time, the flow rate of oxygen is set to, for example, 20 liter/min. Then, the oxidation-preventing insulating film 41 is etched back and thus removed.

Figure 1O:
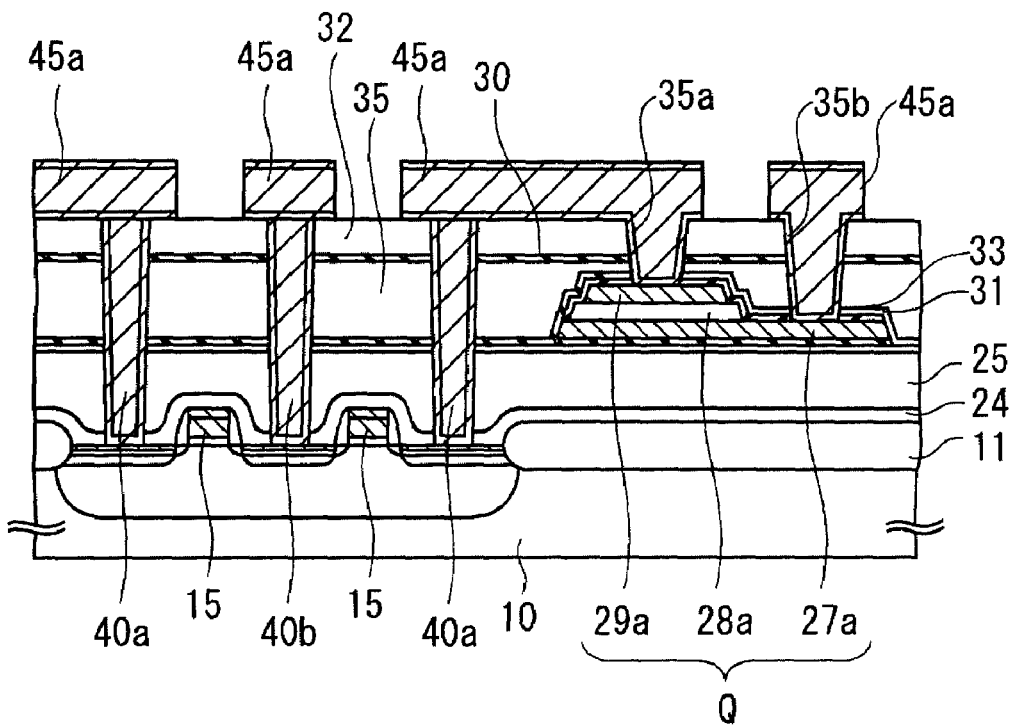

Next, as shown in FIG. 1O, a metal laminated film is formed on the upper surfaces of the second cap insulating layer 32, the first conductive plugs 40a and the second conductive plug 40b and on the inner surfaces of the first via hole 35a and the second via hole 35b, using a sputtering method. In the present embodiment, an approximately 150 nm thick titanium nitride (TiN) film, an approximately 550 nm thick copper-containing aluminum film (Al alloy film), an approximately 5 nm thick titanium (Ti) film, and an approximately 150 nm thick titanium nitride (TiN) film are formed in this order as this metal laminated film.

Then, the abovementioned metal laminated film is patterned by means of photolithography to form main wiring portions 45a intended to compose first metal wirings on the second cap insulating layer 32. Of these main wiring portions 45a, those which are formed above the capacitor Q are electrically connected to the upper electrode 29a and the lower electrode 27a, respectively, through the first and second via holes 35a and 35b. Note that the main wiring portions 45a formed within the first via hole 35a and the second via hole 35b serve as conductive plugs.

In subsequent steps, an interlayer insulating film and a metal wiring are formed on the main wiring portions 45a in this order. The main wiring portions 45a are electrically connected to the upper metal wiring though via holes formed in the interlayer insulating film. One characteristic feature of the present embodiment is that a metal protection film functioning as an etching stopper film is formed on the surfaces of the main wiring portions 45a when forming via holes, and such main wiring portions 45a are defined as first metal wirings.

Figure 2A:
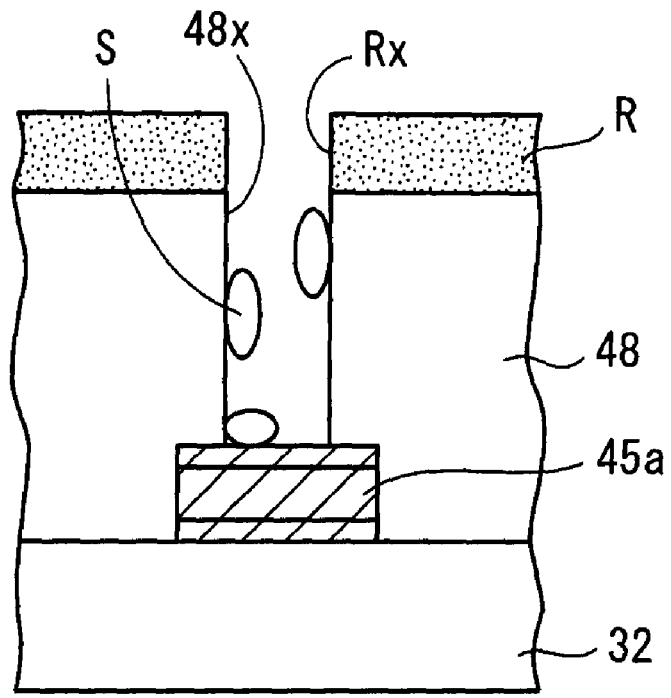
FIGS. 2A and 2B are cross-sectional views illustrating a problem when forming via holes in a case where a metal protection film is not coated on laminated metal wirings.
Figure 2B:
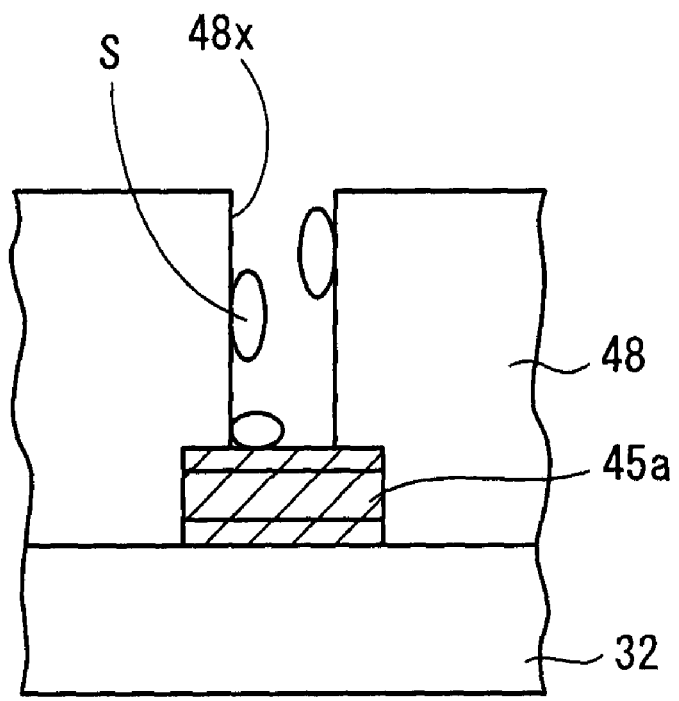

Here, an explanation will be made of a problem with a case where no metal protection films are formed on the surfaces of the main wiring portions 45a. As shown in FIGS. 2A and 2B, an interlayer insulating film 48 is formed on the surface of each main wiring portion 45a formed of a laminated structure (TiN film/Al alloy film/Ti/TiN film), and then a resist pattern R provided with an opening Rx for forming a via hole is formed in a case where no metal protection films are formed on the surfaces of the main wiring portion 45a. In addition, the interlayer insulating film 48 is etched through the opening Rx of the resist pattern R by means of dry etching making use of a fluorine-based gas. As the result of this etching, there is formed a via hole 48x reaching to the main wiring portion 45a. At this time, the uppermost TiN film of the main wiring portion 45a and the fluorine-based gas react with each other during overetching performed to form the via hole 48x, and a foreign substance (reaction product) S adheres to the sidewalls of the via hole 48x.

As shown in FIG. 2B, it is often not possible to remove the foreign substance S produced as the result of reaction between the TiN film and the fluorine-based gas by dry ashing or by later wet cleaning. Thus, the foreign substance remains as a residue of an ashing process. Consequently, an open-circuit failure or a resistance rise occurs in a contact between the main wiring portion 45a and an upper metal wiring, thereby causing degradation in the yield of multilayer interconnections.

In the case of a FeRAM in particular, a foreign substance tends to occur more remarkably than in other cases due to the interlayer insulating film being formed inclusive of an alumina film as described later when forming via holes. Thus, there has been a desire for measures against this problem.

The wiring structure of the present embodiment is capable of solving such a problem as described above. In the present embodiment, the surfaces of the main wiring portions 45a are covered with a metal protection film less likely to react with a fluorine gas.

(First Method of Forming Metal Protection Films)

Figure 3A:
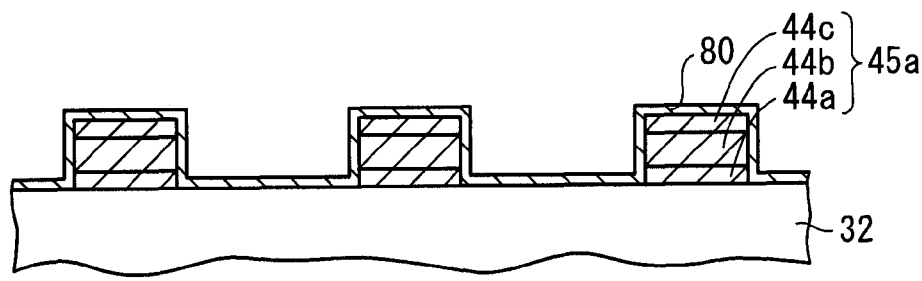
FIGS. 3A to 3D are cross-sectional views illustrating a first method of forming metal protection films in accordance with an embodiment of the present invention.

As shown in FIG. 3A, in a first method of forming metal protection films, a conductive film made of tantalum (Ta) or the like is first formed on the above-described second cap insulating layer 32 and the main wiring portions 45a shown in FIG. 10, using a sputtering method. As the result of this film-forming, there is obtained an approximately 10 to 50 nm thick (preferably 25 nm or so) plating power-supply film 80. Note that alternatively, the plating power-supply film 80 may be formed by means of nonelectrolytic plating.

As the main wiring portions 45a, there are shown, as an example, those which are composed of a TiN film 44a, an Al alloy film 44b, and Ti/TiN film 44c laminated in sequence from the bottom. Alternatively, another metal nitride film may be employed in place of the uppermost Ti/TiN film 44c. Still alternatively, a metal silicide film, such as a cobalt silicide (CoSi) film, may be employed. In addition, the lowermost TiN film 44a may be omitted. Furthermore, another conductive film may be used in place of the Al alloy film 44b. In other words, it is only necessary that the main wiring portions 45a of the present embodiment are laminated films each of which is composed of at least two layers wherein a cap metal film, such as a metal nitride film or a metal silicide film, is formed on a metal pattern film.

Figure 3B:
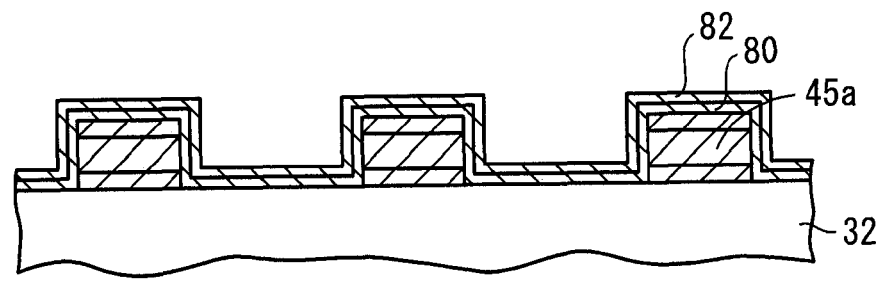

After that, as shown in FIG. 3B, a precious metal film 82 is formed on the plating power-supply film 80 by means of electrolytic plating making use of the plating power-supply film 80 as a power supply path. As the precious metal film 82, it is possible to use a metal selected from a group consisting of gold (Au), silver (Ag), platinum (Pt), palladium (Pd), rhodium (Rh), iridium (Ir), ruthenium (Ru), and osmium (Os).

When, for example, forming a gold film by means of electrolytic plating, a plating liquid (pH: 3.5, temperature: 20 to 40° C.) composed primarily of gold potassium cyanide, citric acid and cobalt sulfate is used and a current density of 0.5 to 1.2 A is adopted.

Unlike a sputtering method, the precious metal film 82 is formed by means of electrolytic plating in the present embodiment. It is therefore possible to form the precious metal film 82 also on the side surfaces of the main wiring portions 45a to the same thickness as that of the upper surfaces thereof.

Figure 3C:
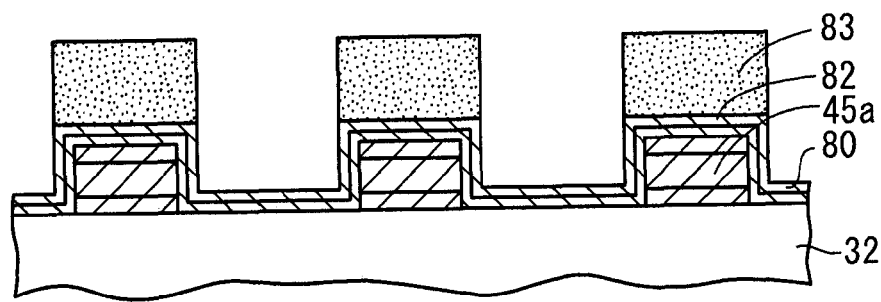

Next, as shown in FIG. 3C, a resist pattern 83 is formed on the parts of the precious metal film 82 covering the main wiring portions 45a by means of photolithography. Then, using this resist pattern 83 as a mask, the precious metal film 82 and the plating power-supply film 80 in each region between the main wiring portions 45a are removed by means of dry etching. After that, the resist pattern 83 is removed.

Figure 3D:
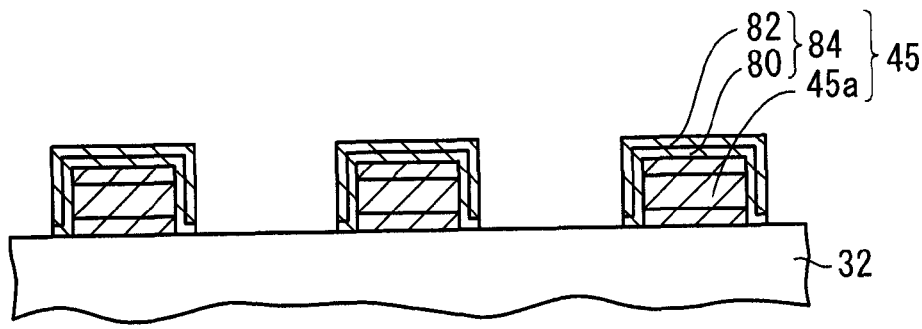

Consequently, as shown in FIG. 3D, a metal protection film 84 composed of the plating power-supply film 80 and the precious metal film 82 is left over on the upper and side surfaces of the main wiring portions 45a. In this way, the upper and side surfaces of the main wiring portions 45a are covered with the metal protection film 84. As a result, first metal wirings 45 each of which is composed of the main wiring portion 45a and the metal protection film 84 covering the main wiring portion 45a is obtained.

Note that the precious metal film 82 may be formed on the upper and side surfaces of the main wiring portions 45a by means of nonelectrolytic plating and defined as the metal protection film 84. In this case, it is possible to simplify the process used since there is no need to form the plating power-supply film 80 and perform patterning. However, it is not possible to precisely perform film thickness control and the like. Accordingly, it is preferable to use electrolytic plating from this viewpoint of precisely performing film thickness control and the like.

Figure 4A:
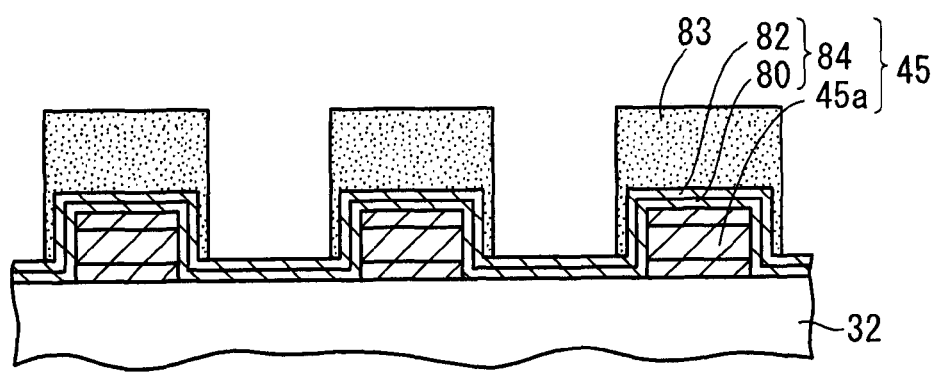
FIGS. 4A and 4B are cross-sectional views illustrating an example of modification of the first method of forming metal protection films in accordance with an embodiment of the present invention.
Figure 4B:
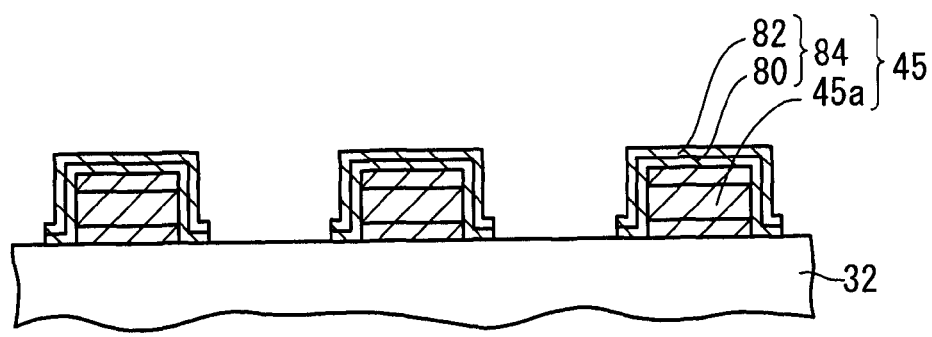

FIGS. 4A and 4B show an example of modification of the first film-forming method. First, as shown in FIG. 4A, there is formed a resist pattern 83, the width of which is slightly greater than the width of the main wiring portions 45a, in the step of forming the resist pattern 83 shown in FIG. 3C. By forming the resist pattern 83 in this way, the parts of the precious metal film 82 covering the side surfaces of the main wiring portions 45a are coated with the resist pattern 83.

In addition, as shown in FIG. 4B, the precious metal film 82 and the plating power-supply film 80 in each region between the main wiring portions 45a are removed by means of dry etching using the resist pattern 83 as a mask. Then, the resist pattern 83 is removed. In the example of modification of the first film-forming method, the precious metal film 82 covering the side surfaces of the main wiring portions 45a is protected by the resist pattern 83 when etching the precious metal film 82 and the plating power-supply film 80 in each region between the main wiring portions 45a. Consequently, there is no possibility of the precious metal film 82 covering the side surfaces of the main wiring portions 45a being etched and thereby reduced. In addition, it is possible to leave a metal protection film 84 having the same thickness as is obtained at the time of film-forming on the side surfaces of the main wiring portions 45a.

(Second Method of Forming Metal Protection Films)

Figure 5A:
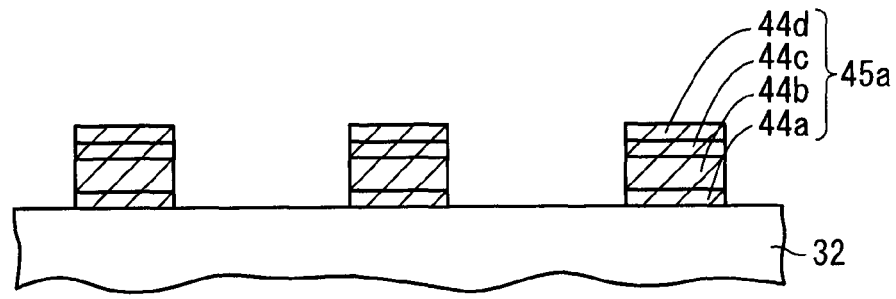
FIGS. 5A to 5E are cross-sectional views illustrating a second method of forming metal protection films in accordance with an embodiment of the present invention.

In a second method of forming metal protection films, as shown in FIG. 5A, a platinum (Pt) film 44d is additionally formed on the uppermost layers of the main wiring portions 45a shown in FIG. 10. That is, the main wiring portions 45a are formed by laminating a TiN film 44a, an Al alloy film 44b, a Ti/TiN film 44c and a Pt film 44d in sequence from the bottom. When forming such main wiring portions 45a of a laminated structure as described above, the Pt film 44d is first etched by means of dry etching making use of an Ar/Cl$_2$ mixed gas and having a strong sputtering effect. Next, the underlying metal film of the Pt film 44d is etched by changing to the etching conditions of a normal Al laminated film. Note that the Pt film 44d is only one example of a cap precious metal film and other various types of precious metal films which function as the metal protection film 84 described above may be used as the cap precious metal film.

Figure 5B:
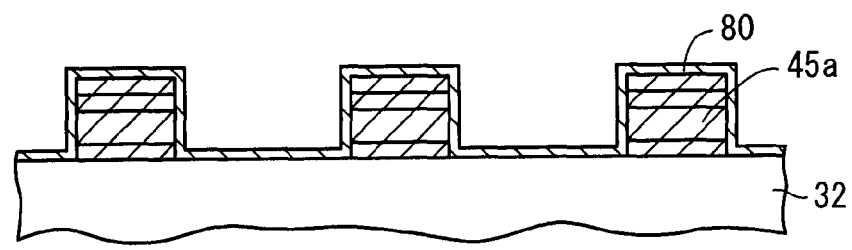
Figure 5C:
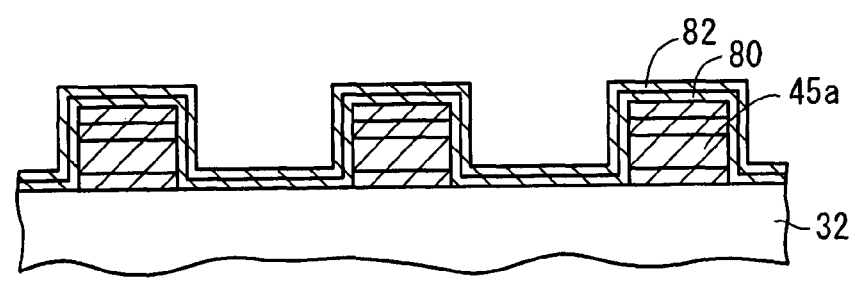

Next, as shown in FIG. 5B, the plating power-supply film 80 is formed on the second cap insulating layer 32 and the main wiring portions 45a in the same way as the first film-forming method. In addition, as shown in FIG. 5C, the precious metal film 82 is formed on the plating power-supply film 80 by means of electrolytic plating making use of the plating power-supply film 80 as a power supply path.

Figure 5D:
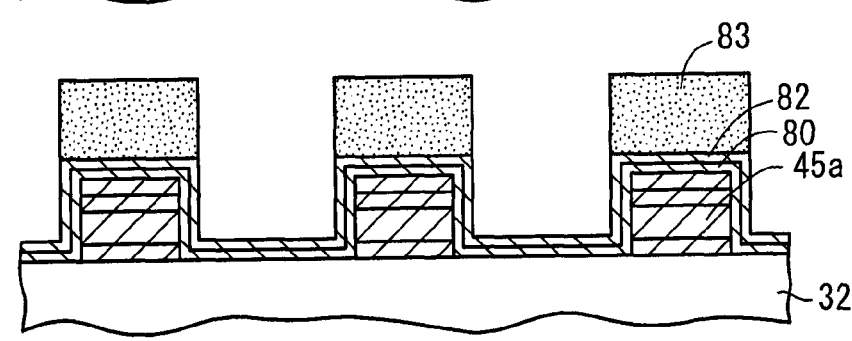
Figure 5E:
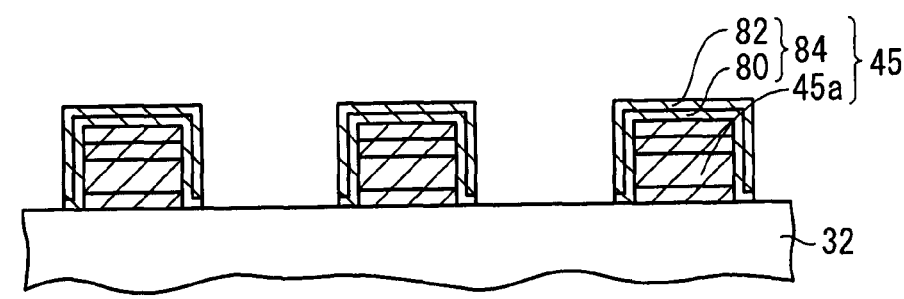

Next, as shown in FIG. 5D, a resist pattern 83 is formed on the parts of the precious metal film 82 covering the main wiring portions 45a. Then, as shown in FIG. 5E, the precious metal film 82 and the plating power-supply film 80 present between the main wiring portions 45a are removed by means of dry etching using the resist pattern 83 as a mask. After that, the resist pattern 83 is removed.

According to such a process as described above, the metal protection film 84 composed of the plating power-supply film 80 and the precious metal film 82 are coated onto the upper and side surfaces of the main wiring portions 45a. As a result, there is obtained first metal wirings 45 each of which is composed of the main wiring portion 45a and the metal protection film 84 covering the main wiring portion 45a.

In the second film-forming method, the Pt films 44d functioning as metal protection films are previously formed on top of the main wiring portions 45a and the metal protection films 84 covering the main wiring portions 45a are further formed. Consequently, it is possible to set the thickness of the metal protection film 84 on the upper surfaces of the main wiring portions 45a greater than that on the side surfaces thereof. Accordingly, the metal protection film 84 has a structure convenient for use as an etching stopper film when forming via holes.

Figure 6A:
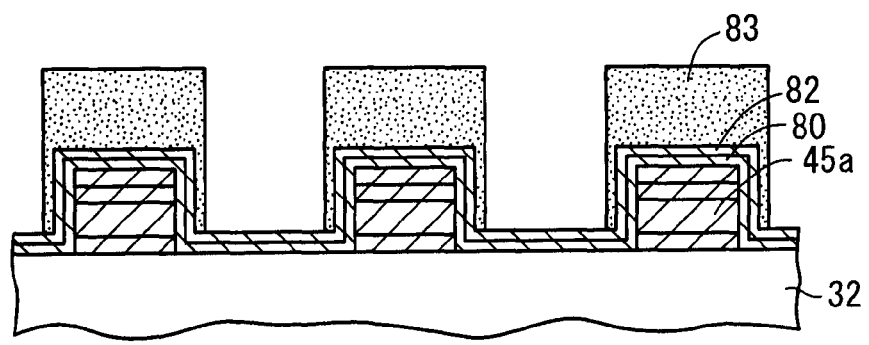
FIGS. 6A and 6B are cross-sectional views illustrating an example of modification of the second method of forming metal protection films in accordance with an embodiment of the present invention.
Figure 6B:
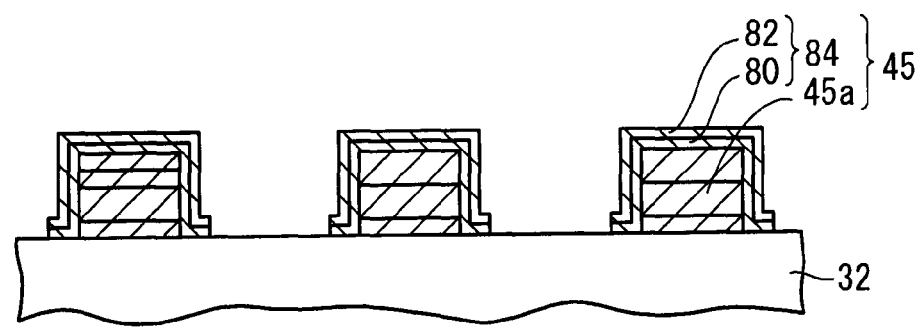

FIGS. 6A and 6B show a modified example of the second film-forming method. First, as shown in FIG. 6A, the width of the resist pattern 83 is set slightly greater than that of the main wiring portions 45a in the above-described step of forming the resist pattern 83 shown in FIG. 5D. In this way, the resist pattern 83 is formed so as to coat the precious metal film 82 covering the side surfaces of the main wiring portions 45a. Next, as shown in FIG. 6B, the precious metal film 82 and the plating power-supply film 80 in each region between the main wiring portions 45a are likewise etched using the resist pattern 83 as a mask, and then the resist pattern 83 is removed. As a result, there is formed the metal protection film 84 covering the upper and side surfaces of the main wiring portions 45a, and the first metal wirings 45 having such a configuration are obtained.

In the example of modification of the second film-forming method, it is possible to set the thickness of the metal protection film 84 on the upper surfaces of the main wiring portions 45a greater than that on the side surfaces thereof. In addition, there is no possibility of the metal protection film 84 on the side surfaces of the main wiring portions 45a being reduced.

In the above-described first and second film-forming methods, the precious metal film 82 and the plating power-supply film 80 in each region between the main wiring portions 45a need to be removed by means of etching. On the other hand, the workability of the precious metal film 82 is poor if it is thick. From this point of view, it is preferable that the thickness of the precious metal film 82 be set to the minimum value (preferably 5 to 40 nm) at which it still functions as an etching stopper film.

(Third Method of Forming Metal Protection Films)

Figure 7A:
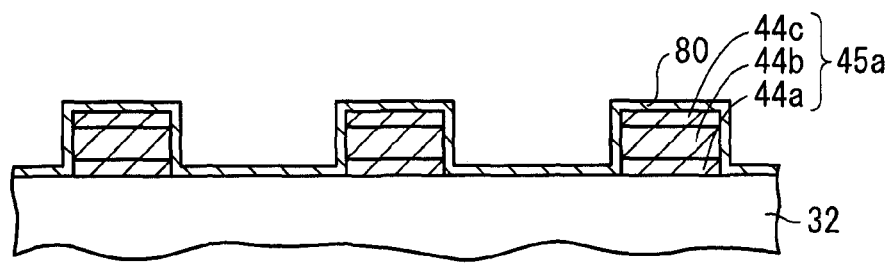
FIGS. 7A to 7E are cross-sectional views illustrating a third method of forming metal protection films in accordance with an embodiment of the present invention.
Figure 7B:
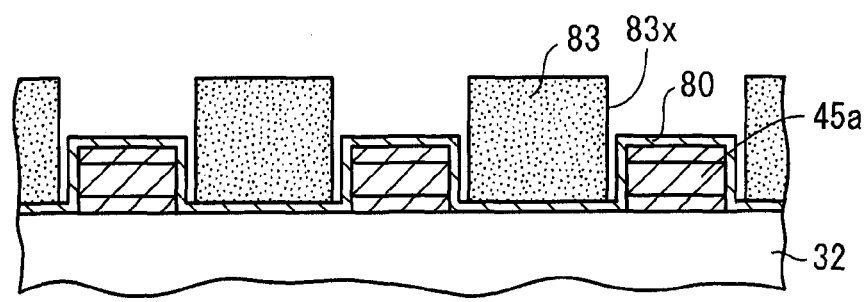

In a third method of forming metal protection films, as shown in FIG. 7A, a plating power-supply film 80 is first formed on the above-described second cap insulating layer 32 and the main wiring portions 45a shown in FIG. 10 in the same way as the first film-forming method. After that, as shown in FIG. 7B, a resist pattern 83 is formed in each region between the main wiring portions 45a. Specifically, the resist pattern 83 provided with an opening 83x wider than the width of the main wiring portions 45a covered with the plating power-supply film 80 is formed on the plating power-supply film 80 in each region between the main wiring portions 45a.

Figure 7C:
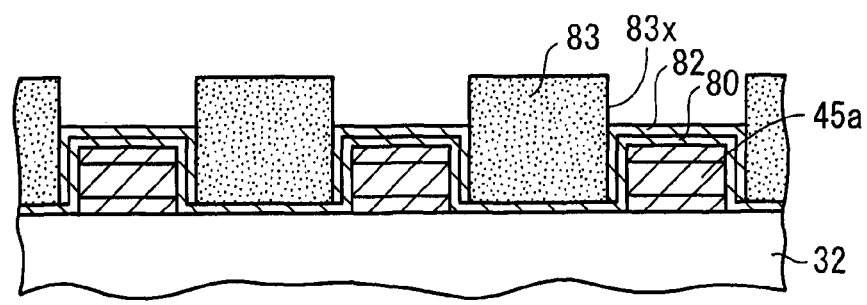

In addition, as shown in FIG. 7C, a precious metal film 82 is formed within the opening 83x (specifically, in the gaps lateral to the main wiring portion 45a and on the upper-surface side thereof within the opening 83x) of the resist pattern 83 by means of electrolytic plating making use the plating power-supply film 80 as a power supply path. In the third film-forming method, the precious metal film 82 having an approximately uniform thickness is formed on the upper and side surfaces of the main wiring portions 45a.

Figure 7D:
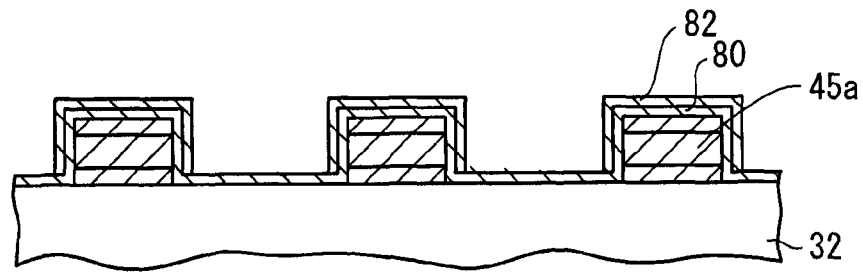
Figure 7E:
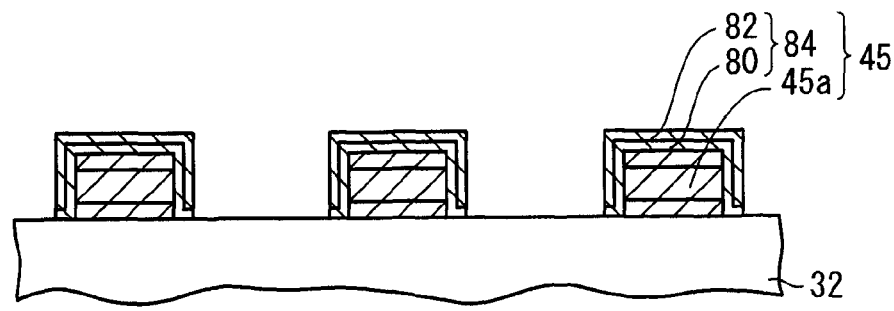

Next, as shown in FIG. 7D, the resist pattern 83 is removed to expose the plating power-supply film 80. In addition, as shown in FIG. 7E, the plating power-supply film 80 is removed by means of dry etching using the precious metal film 82 formed on the upper and side surfaces of the main wiring portions 45a as a mask. As a result, there is formed the metal protection film 84 composed of the plating power-supply film 80 and the precious metal film 82 covering the upper and side surfaces of the main wiring portions 45a, and the first metal wirings 45 having such a configuration are obtained. Note that if the reduction of the precious metal film 82 is a problem, a resist pattern (not shown in the figure) may be formed on the precious metal film 82 and the plating power-supply film 80 may be etched using the resist pattern as a mask after the step shown in FIG. 7D.

In addition, the plating power-supply film 80 may be omitted and the precious metal film 82 may be formed in the gaps lateral to the main wiring portions 45a and on the upper-surface sides thereof by means of nonelectrolytic plating, so as to serve as the metal protection film 84.

Figure 8A:
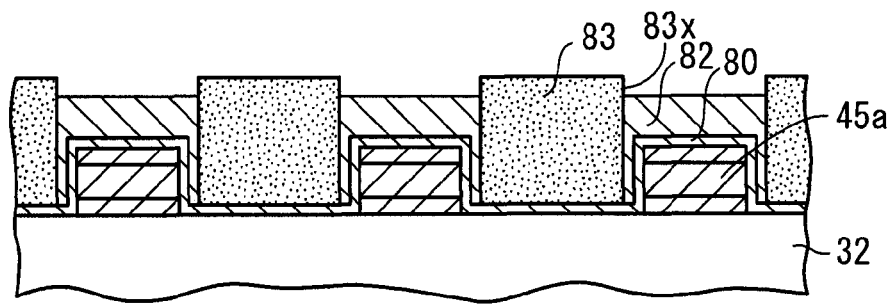
FIGS. 8A to 8D are cross-sectional views illustrating a first example of modification of the third method of forming metal protection films in accordance with an embodiment of the present invention.

As a first example of modification of the third film-forming method, as shown in FIG. 8A, a precious metal plated film is formed on the upper-surface sides of the main wiring portions 45a in the opening 83x of the resist pattern 83 to an even greater thickness in the above-described step of forming the precious metal film 82 shown in FIG. 7C, by extending the treating time of electrolytic plating. As a result, the thickness of the precious metal film 82 on the upper-surface sides of the main wiring portions 45a is set greater than that on the lateral sides thereof. For example, it is possible to easily set the thickness of the precious metal film 82 on the upper-surface sides of the main wiring portions 45a two to three times greater than the thickness (for example, 40 nm) on the lateral sides thereof.

Figure 8B:
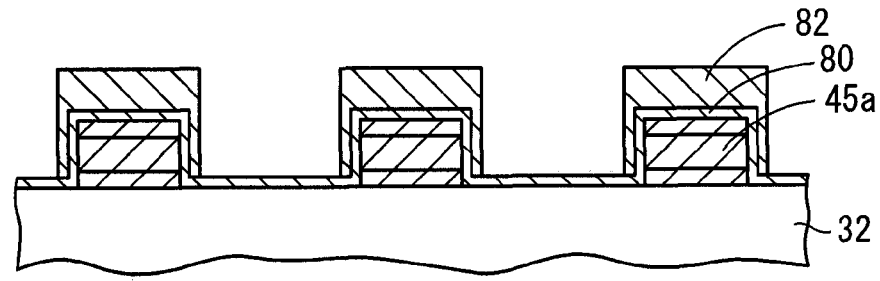
Figure 8C:
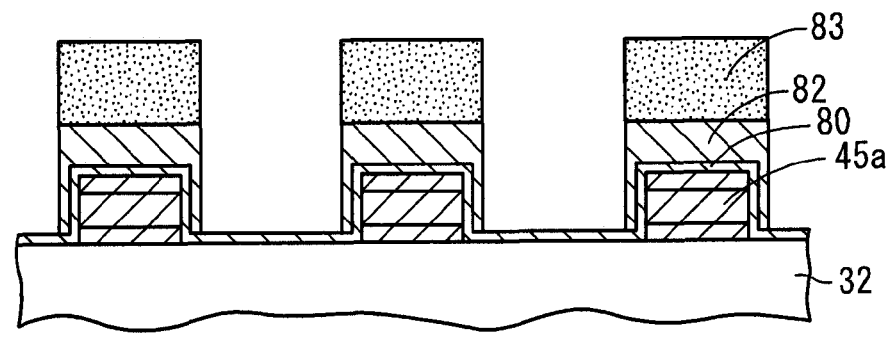
Figure 8D:
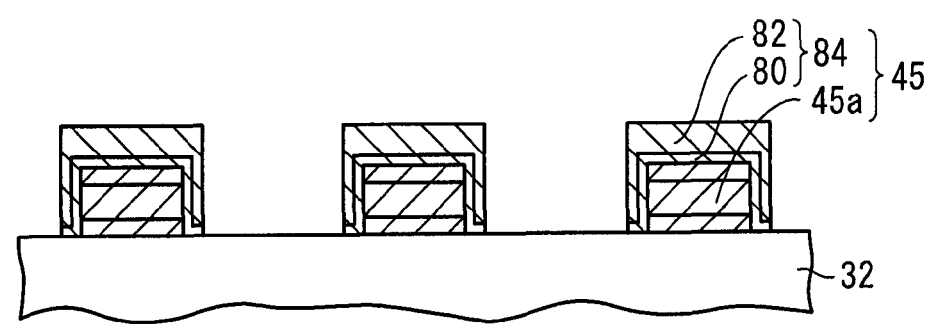

Next, as shown in FIG. 8B, the resist pattern 83 is removed to expose the plating power-supply film 80. Then, as shown in FIG. 8C, a resist pattern 83 is formed on the parts of the precious metal film 82 covering the main wiring portions 45a. In addition, as shown in FIG. 8D, the plating power-supply film 80 is etched and thus removed using the resist pattern 83 as a mask.

Instead of forming the resist pattern 83, the plating power-supply film 80 may be removed by means of etch-back process.

Consequently, the plating power-supply film 80 and the precious metal film 82 covering the upper and side surfaces of the main wiring portions 45a are obtained. In addition, there is formed a metal protection film 84 composed of the plating power-supply film 80 and the precious metal film 82. As a result, first metal wirings 45 configured as described above, are obtained.

In the first example of modification of the third film-forming method, it is possible to easily set the thickness of the metal protection film 84 on the upper-surface sides of the main wiring portions 45a greater than the thickness on the side surfaces thereof, by adjusting the treating time of electrolytic plating. Consequently, the stopper portion becomes thicker when forming via holes. Accordingly, the metal protection film 84 can endure a significantly high degree of overetching and forms into a structure convenient for use as an etching stopper film.

Figure 9A:
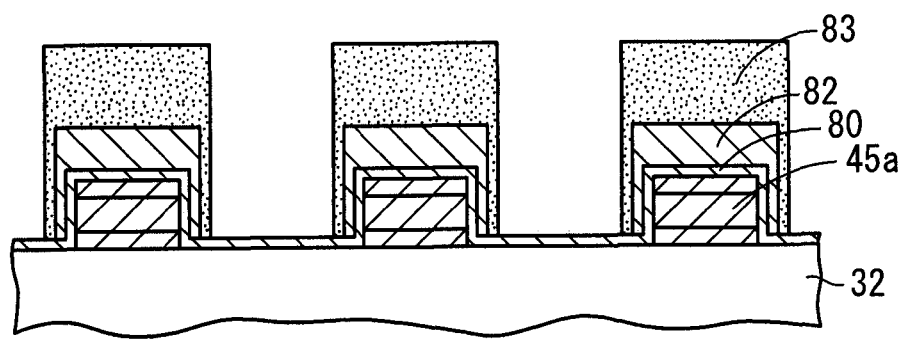
FIGS. 9A and 9B are cross-sectional views illustrating a second example of modification of the third method of forming metal protection films in accordance with an embodiment of the present invention.
Figure 9B:
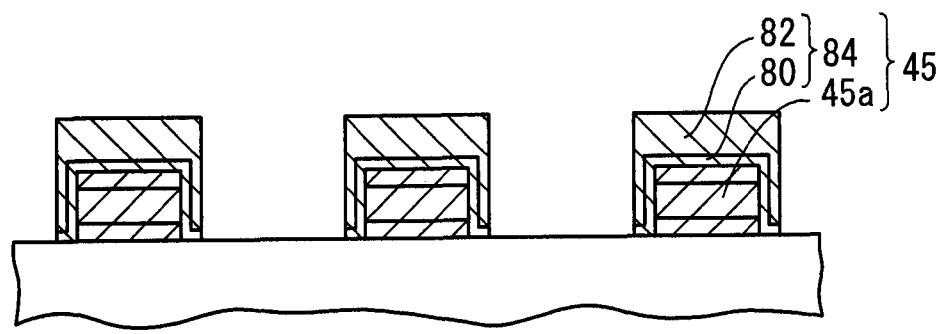

Furthermore, in contrast to the above-described first example of modification of the third film-forming method, the resist pattern 83 is formed so that the width thereof is slightly greater than the width of the main wiring portions 45a, as shown in FIG. 9A, in the second example of modification of the third film-forming method. Specifically, in the step of forming the resist pattern 83 shown in FIG. 8C, the resist pattern 83 is formed so that the width thereof is slightly greater than the width of the main wiring portions 45a. As the result of forming the resist pattern 83 in this way, the parts of the precious metal film 82 covering the side surfaces of the main wiring portions 45a are coated with the resist pattern 83. Then, the plating power-supply film 80 is likewise removed by means of dry etching using the resist pattern 83 as a mask. As described above, in the second example of modification of the third film-forming method, there is no possibility of the metal protection film 84 on the upper and side surfaces of the main wiring portions 45a being reduced when etching the plating power-supply film 80.

(Fourth Method of Forming Metal Protection Films)

Figure 10A:
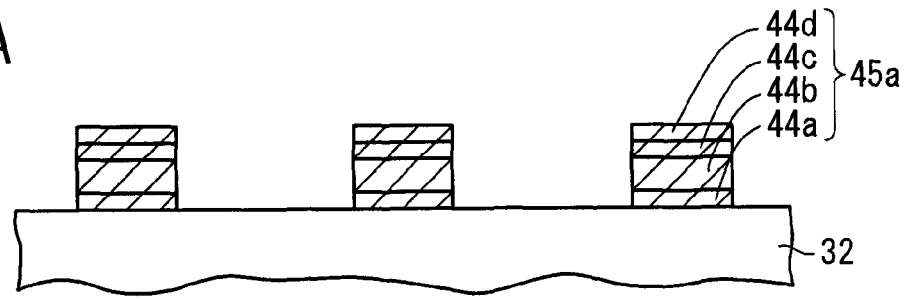
FIGS. 10A to 10E are cross-sectional views illustrating a fourth method of forming metal protection films in accordance with an embodiment of the present invention.
Figure 10B:
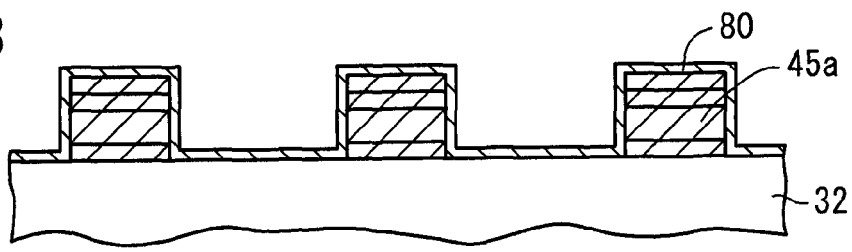
Figure 10C:
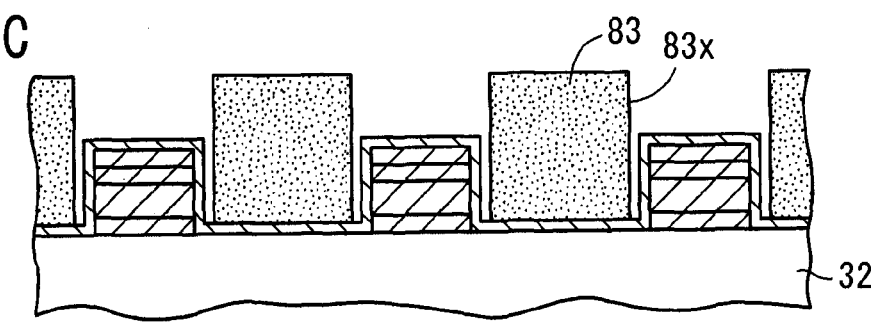

In a fourth method of forming metal protection films, as shown in FIG. 10A, there are formed main wiring portions 45a on top of which platinum films 44d are additionally formed in the same way as the second film-forming method. Next, as shown in FIG. 10B, a plating power-supply film 80 is formed on the second cap insulating layer 32 and the main wiring portions 45a in the same way as the second film-forming method. In addition, as shown in FIG. 10C, a resist pattern 83 is formed in the same way as the third film-forming method. That is, the resist pattern 83 provided with an opening 83x wider than the width of the main wiring portions 45a covered with the plating power-supply film 80 is formed on the plating power-supply film 80 in each region between the main wiring portions 45a.

Figure 10D:
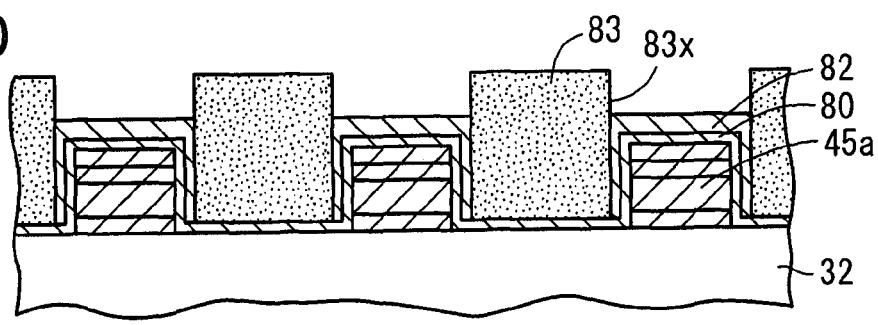
Figure 10E:
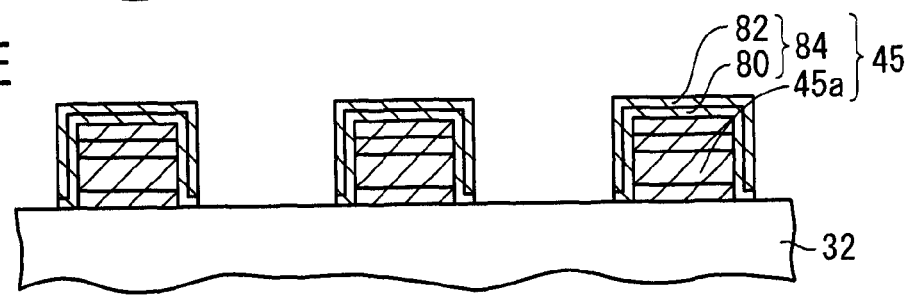

Next, as shown in FIG. 10D, a precious metal film 82 is formed in the gaps lateral to the main wiring portions 45a and on the upper-surface sides thereof by applying precious metal plating to within the opening 83x of the resist pattern 83 by means of electrolytic plating. In addition, as shown in FIG. 10E, the plating power-supply film 80 is removed by means of dry etching using the precious metal film 82 as a mask after removing the resist pattern 83.

Figure 11A:
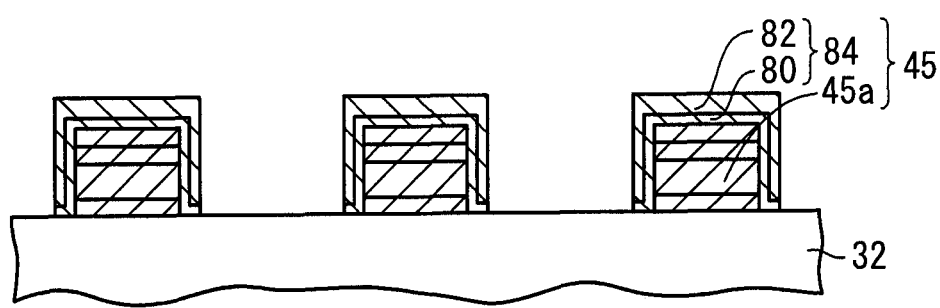
FIGS. 11A and 11B are cross-sectional views illustrating a first example of modification of the fourth method of forming metal protection films in accordance with an embodiment of the present invention.
Figure 11B:
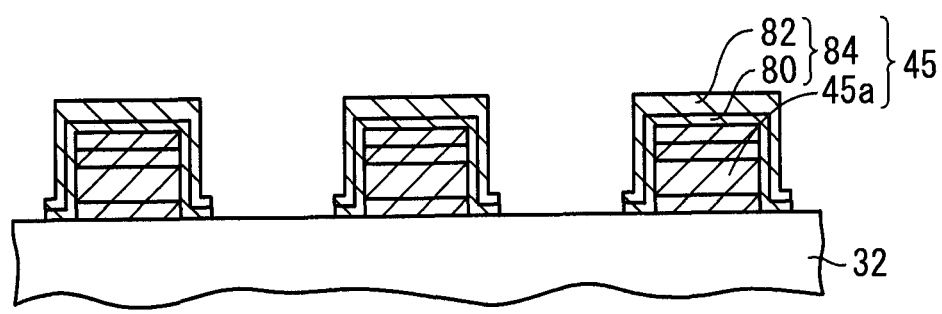

FIGS. 11A and 11B show a first example of modification of the fourth film-forming method. In this example of modification, as shown in FIG. 11A, a resist pattern (not shown in the figure) is formed on the parts of the precious metal film 82 covering the main wiring portions 45a after removing the resist pattern 83 shown in FIG. 10D. Then, the plating power-supply film 80 is removed by means of dry etching using this resist pattern as a mask. In this case, the reduction of the precious metal film 82 on the upper surfaces of the main wiring portions 45a does not occur when etching the plating power-supply film 80.

Note that the plating power-supply film 80 may be omitted and the precious metal film 82 may be formed in the gaps lateral to the main wiring portions 45a and on the upper-surface sides thereof by means of nonelectrolytic plating.

In addition, as the second example of modification of the fourth film-forming method, as shown in FIG. 11B, there is formed a resist pattern (not shown in the figure) the width of which is slightly greater than the width of the main wiring portions 45a. Next, the plating power-supply film 80 is removed by means of dry etching with the parts of the precious metal film 82 on the side surfaces of the main wiring portions 45a coated with the above-noted resist pattern. In this case, the precious metal film 82 is prevented from being reduced both on the upper surfaces and on the lateral sides of the main wiring portions 45a.

(Fifth Method of Forming Metal Protection Films)

Figure 12A:
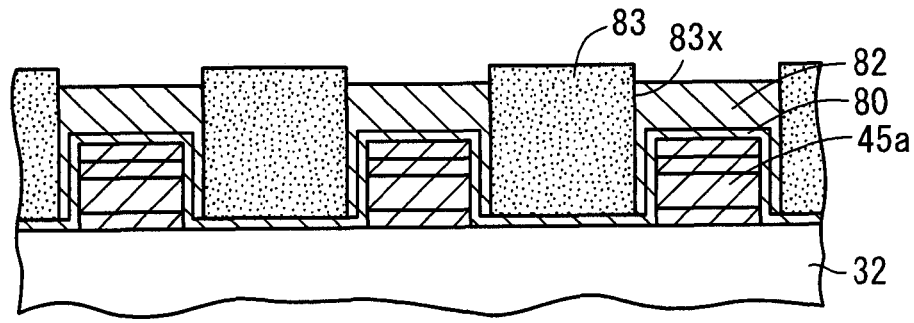
FIGS. 12A to 12D are cross-sectional views illustrating a fifth method of forming metal protection films in accordance with an embodiment of the present invention.

In a fifth film-forming method, the treating time of electrolytic plating is extended in the above-described fourth film-forming method, as shown in FIG. 12A. Specifically, the treating time of electrolytic plating is extended in the step of forming the precious metal film 82 shown in FIG. 10D. By slowing down the speed of depositing the precious metal film in this way, it is possible to form the film of precious metal plating on the upper-surface sides of the main wiring portions 45a to an even greater thickness. As a result, the thickness of the precious metal film 82 on the upper-surface sides of the main wiring portions 45a is set greater than that on the lateral sides thereof.

Figure 12B:
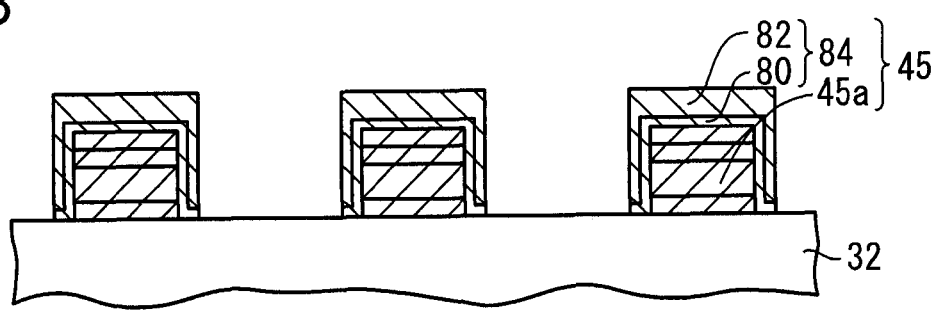

Then, as shown in FIG. 12B, dry etching is performed using the precious metal film 82 as a mask after removing the resist pattern 83, in order to selectively remove the plating power-supply film 80.

Figure 12C:
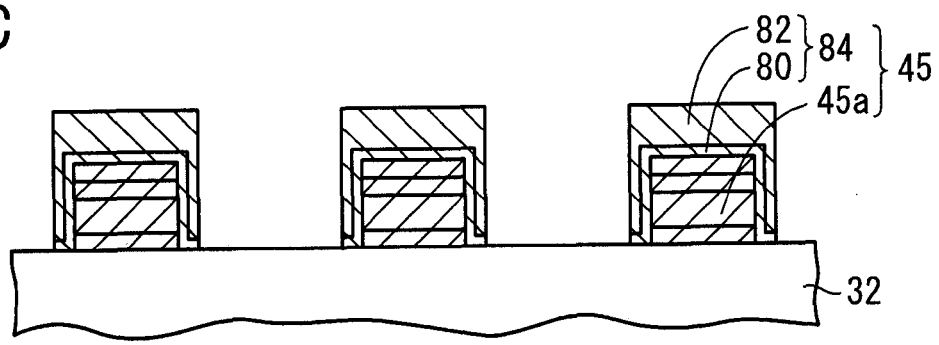

FIG. 12C shows a first example of modification of the fifth film-forming method. As shown in FIG. 12C, a resist pattern (not shown in the figure) is formed on the parts of the precious metal film 82 covering the main wiring portions 45a, and the plating power-supply film 80 is removed by means of dry etching using the resist pattern as a mask. In this case, the reduction of the precious metal film 82 on the upper surfaces of the main wiring portions 45a does not occur when etching the plating power-supply film 80.

Figure 12D:
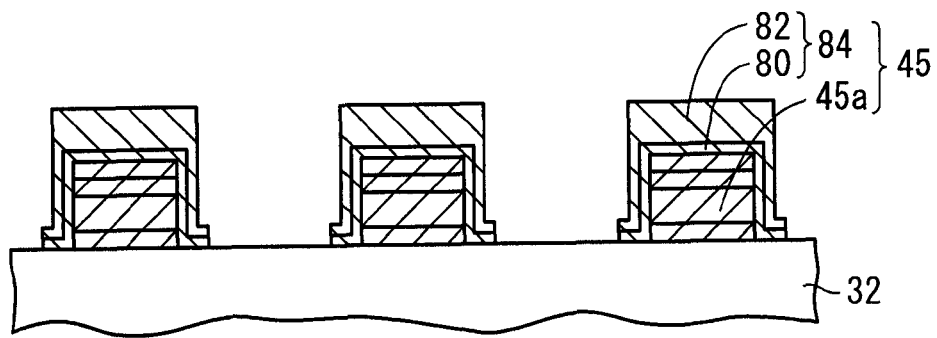

Furthermore, FIG. 12D shows a second example of modification of the fifth film-forming method. As shown in FIG. 12D, there is formed a resist pattern (not shown in the figure) the width of which is slightly greater than the width of the main wiring portions 45a. That is, the plating power-supply film 80 is removed by means of dry etching with the parts of the precious metal film 82 covering the side surfaces of the main wiring portions 45a coated with the above-noted resist pattern. In this case, the precious metal film 82 is prevented from being reduced both on the upper surfaces and on the lateral sides of the main wiring portions 45a.

Note that in the third to fifth film-forming methods, there is no need to pattern the precious metal film 82 by means of etching since the precious metal film 82 is not formed between the main wiring portions 45a. Accordingly, in the fifth film-forming method in particular, it is possible to increase the thickness (40 nm or greater) of the precious metal film 82 on the upper-surface sides of the main wiring portions 45a, thereby allowing the precious metal film 82 to have a structure even more convenient for use as an etching stopper film.

(Sixth Method of Forming Metal Protection Films)

Figure 13A:
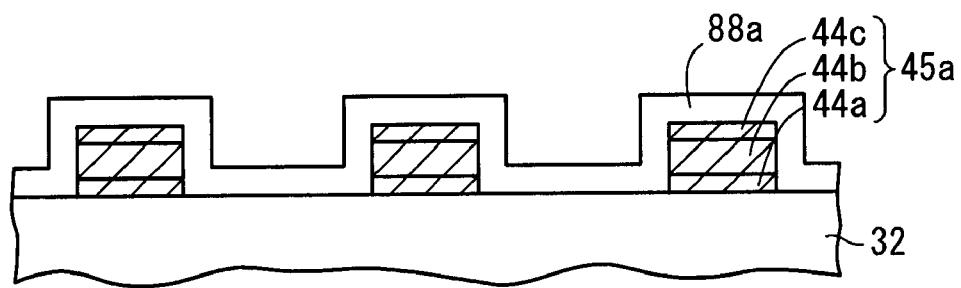
FIGS. 13A to 13C are cross-sectional views illustrating a sixth method of forming metal protection films in accordance with an embodiment of the present invention.
Figure 13B:
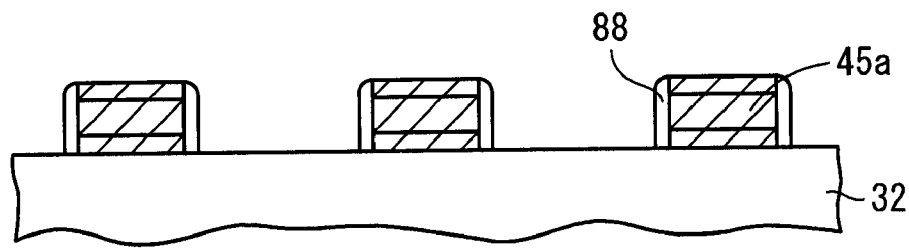
Figure 13C:
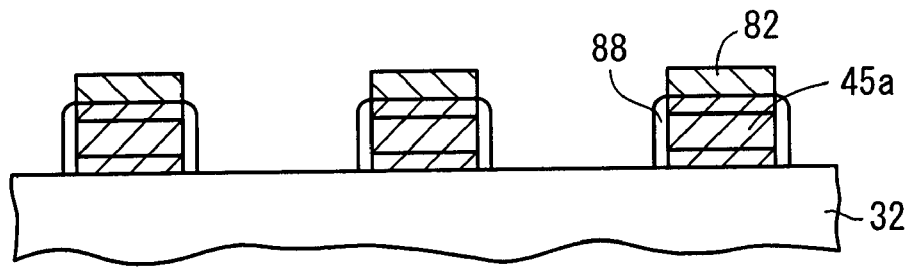

FIGS. 13A to 13C show a sixth method of forming metal protection films. In this film-forming method, metal protection films are formed only on the upper surfaces of main wiring portions 45a, and first metal wirings are thus configured. In addition, sidewall spacers formed of hard-to-etch insulators, such as silicon nitride, are formed on the side surfaces of the first metal wirings. That is, as shown in FIG. 13A, a silicon nitride film 88a is first formed on the above-described second cap insulating layer 32 and the main wiring portions 45a shown in FIG. 10 using a CVD method. In addition, as shown in FIG. 13B, overall etching is performed on the silicon nitride film 88a by means of RIE to leave sidewall spacers 88 on the side surfaces of the main wiring portions 45a.

Then, as shown in FIG. 13C, approximately 5 to 100 nm thick precious metal films 82 are selectively formed on TiN films 44c exposed on the upper surfaces of the main wiring portions 45a by means of nonelectrolytic plating.

When forming films made of gold as the precious metal films 82, there is used a nonelectrolytic plating liquid (pH: 12 to 13, temperature: 60 to 90° C.) composed primarily of gold potassium cyanide, tripotassium citrate hydrate, potassium cyanide, and dimethyl amine borane.

In addition, when forming films composed of platinum as the precious metal films 82, there is used a nonelectrolytic plating liquid (pH: 10 to 12, temperature: 50 to 70° C.) composed primarily of ammine platinum chloride and hydrazine hydrate.

As the result of using nonelectrolytic plating in this way, almost no plating is applied onto the second cap insulating layer 32 and the sidewall spacers 88. Thus, it is possible to selectively form the precious metal films 82 only on the upper surfaces (on the TiN films 44c) of the main wiring portions 45a. Note that as in the above-described second film-forming method, precious metal films (such as Pt films) may be previously formed on the upper surfaces of the TiN films 44c. In this case, the precious metal films 82 can be formed in an even more stable manner.

As heretofore described in the first to fifth methods of forming metal protection films, it is possible to easily form the metal protection film 84 composed of the plating power-supply film 80 and the precious metal film 82 on the upper and side surfaces of the main wiring portions 45a by means of electrolytic plating.

In addition, as explained in the sixth method of forming metal protection films, it is possible to easily form the metal protection film 84 composed of the precious metal film 82 on the upper surfaces of the main wiring portions 45a by means of nonelectrolytic plating.

Figure 1P:
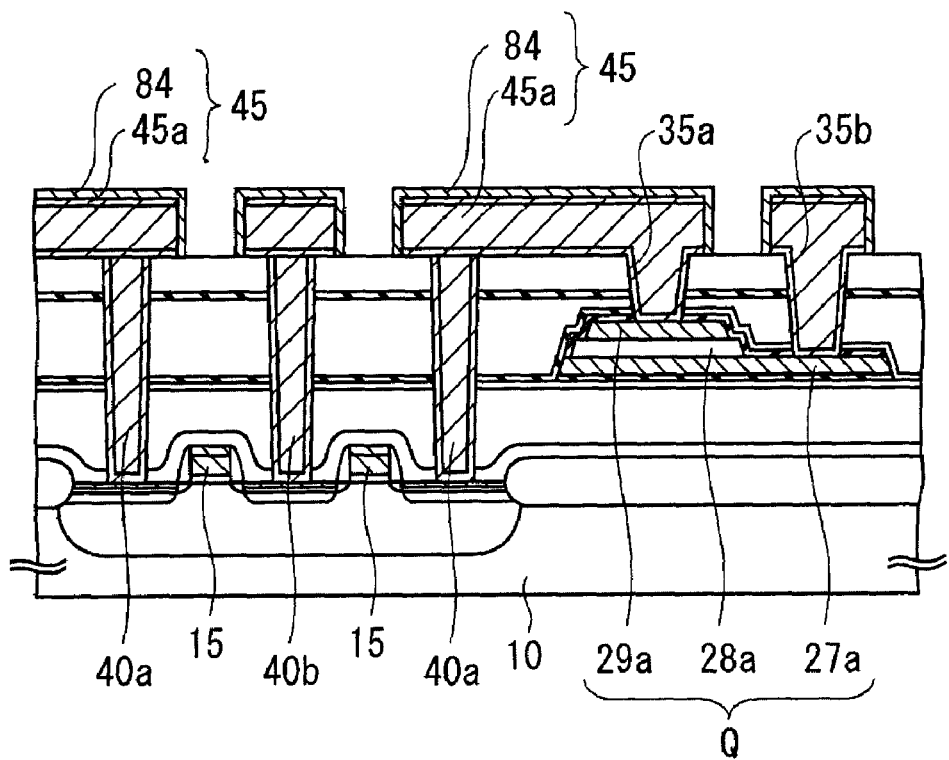

Returning now to the explanation of a method of manufacturing an FeRAM, the upper and side surfaces of the main wiring portions 45a are covered with the metal protection film 84 and thus the first metal wirings 45 are configured as shown in FIG. 1P, according to the methods of forming metal protection films heretofore described. Alternatively, as described above, only the upper surfaces of the main wiring portions 45a may be covered with the metal protection film 84. Note that the first metal wirings 45 are electrically connected to the upper electrode 29a and the lower electrode 27a of a capacitor Q (ferroelectric capacitor) in the FeRAM.

When using the first metal wirings 45 having such a structure as described above, covering the wirings with the precious metal film 82 made of a metal other than gold and silver is effective in increasing the strength of the wirings. Thus, it is possible to prevent the capacitor Q in the FeRAM from deteriorating due to a stress.

Figure 1Q:
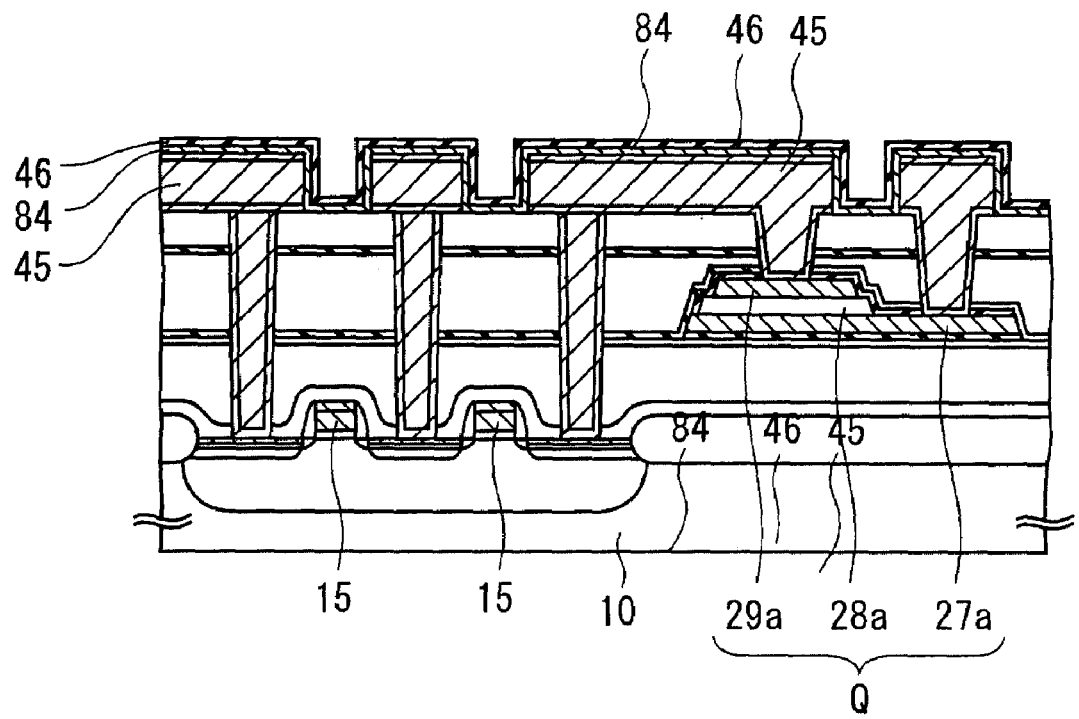

Next, as shown in FIG. 1Q, an alumina film is formed to a thickness of 20 nm as a fourth capacitor protection insulating film 46 for covering the first metal wirings 45 and the second cap insulating layer 32, using a sputtering method.

This fourth capacitor protection insulating film 46 has the function to block reducing substances, such as hydrogen and moisture, and thereby protect the capacitor dielectric film 28a. Films having such a function as described above include a titanium oxide film, a zirconium oxide film, a magnesium oxide film and a titanium magnesium oxide film, in addition to the alumina film. Anyone of these films may be formed as the fourth capacitor protection insulating film 46.

Note that if the capacitor dielectric film 28a does not deteriorate even when the fourth capacitor protection insulating film 46 is not formed, then the fourth capacitor protection insulating film 46 may be omitted.

Figure 1R:
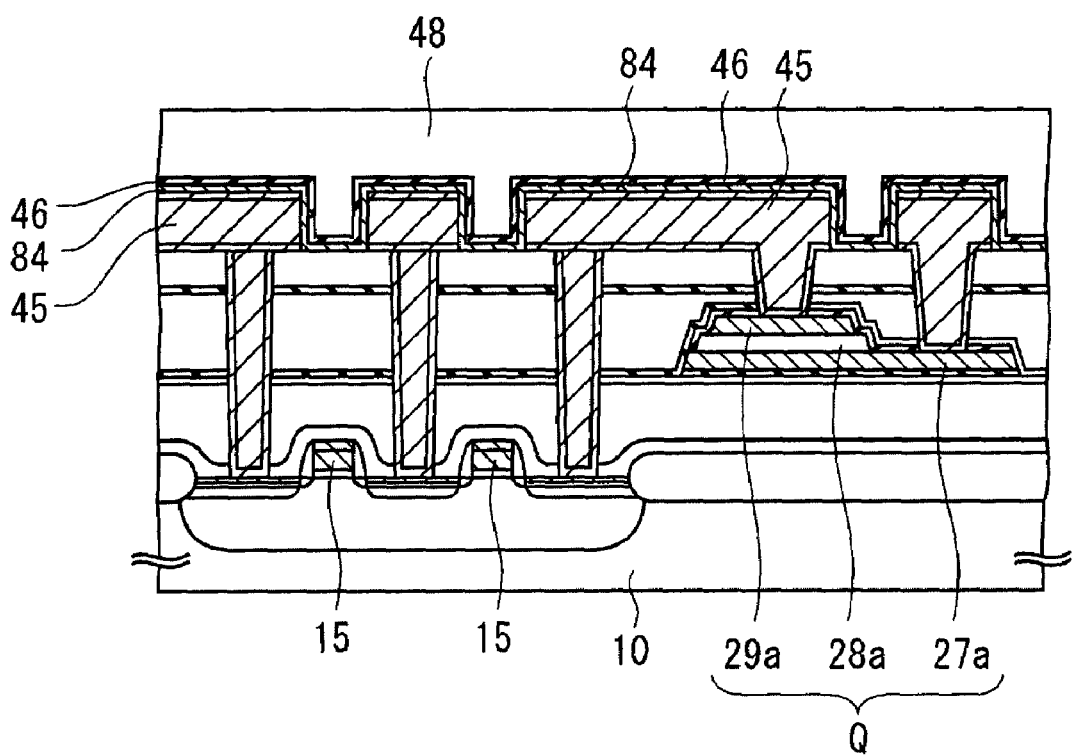

Next, as shown in FIG. 1R, a silicon dioxide film is formed on the fourth capacitor protection insulating film 46 using a plasma CVD method making use of a TEOS gas and oxygen as reactant gases. Then, this silicon dioxide film is defined as a second interlayer insulating film 48. The thickness of this second interlayer insulating film 48 is, for example, approximately 2600 nm above the first metal wirings 45.

After that, the upper surface of the second interlayer insulating film 48 is polished by means of CMP, in order to planarize the surface.

Figure 1S:
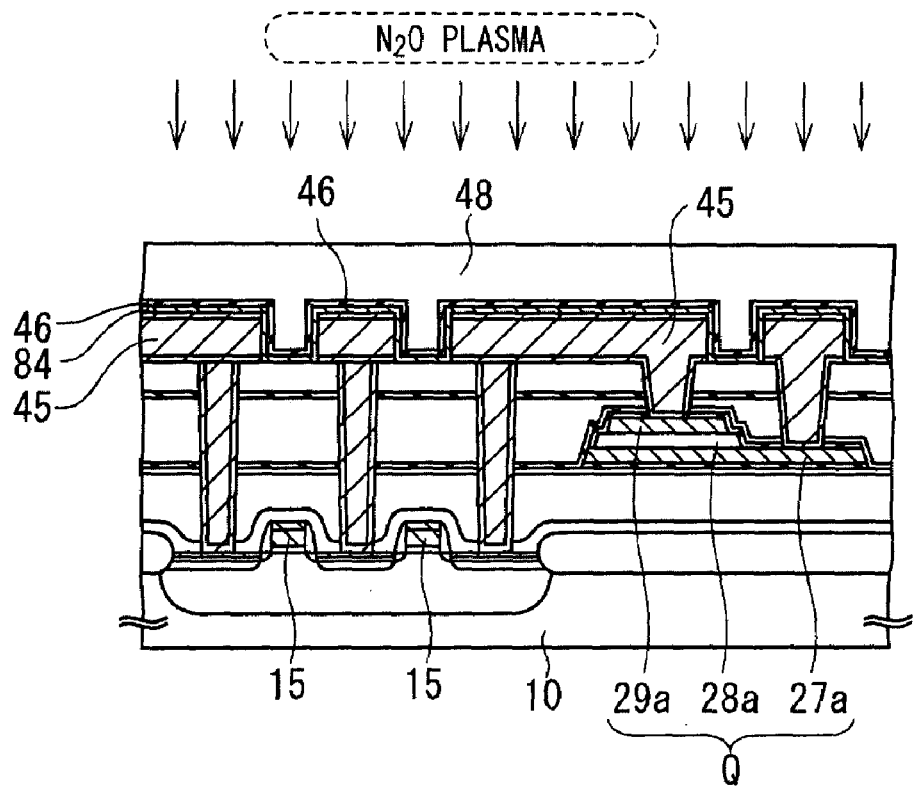

Next, as shown in FIG. 1S, an $N_2O$ plasma treatment is performed on the surface of the second interlayer insulating film 48. Specifically, the $N_2O$ plasma treatment is performed within a CVD apparatus on the condition of a substrate temperature of approximately 350° C. and a treating time of approximately 4 minutes. As the result of performing such an $N_2O$ plasma treatment as described above, the second interlayer insulating film 48 is dehydrated and the surface thereof nitrided. Thus, it is possible to prevent silicon dioxide having a high affinity for water from absorbing moisture.

Note that an $NH_3$ plasma treatment with a substrate temperature of 350° C. and a treating time of 10 minutes may be performed instead of the $N_2O$ plasma treatment.

Figure 1T:
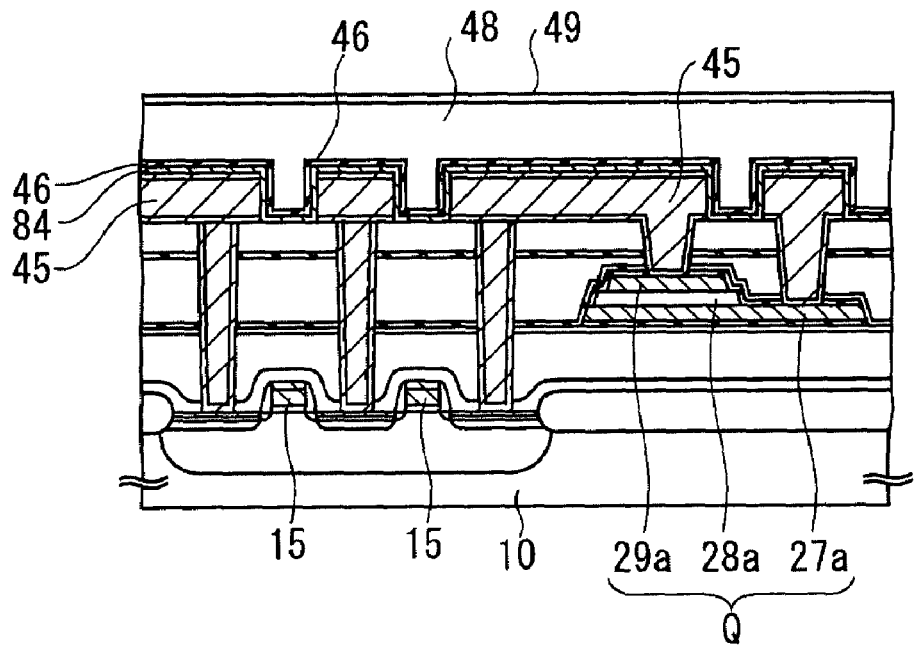

Next, as shown in FIG. 1T, a silicon dioxide film is formed on the second interlayer insulating film 48 to a thickness of approximately 100 nm as a third cap insulating layer 49 using, for example, a plasma CVD method making use of a TEOS gas.

Note here that there are formed microscopic scratches (micro-scratches) on the upper surface of the second interlayer insulating film 48 due to the contact of the surface with the pad of a CMP apparatus when CMP is performed (see FIG.

1R). The above-described third cap insulating layer 49 assumes the role of filling these scratches and planarizing the surface.

Figure 1U:
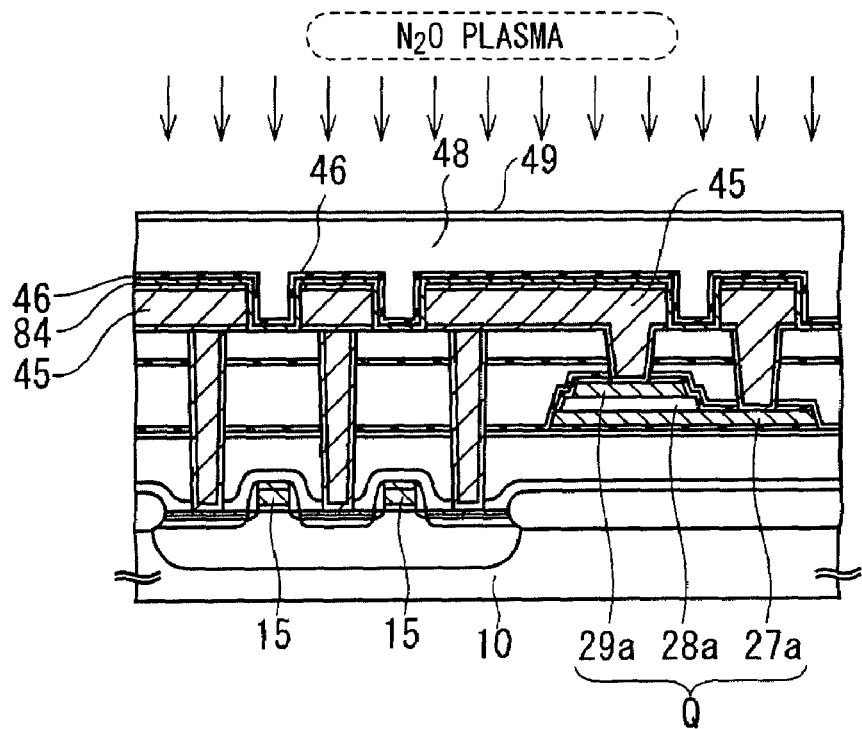

Next, as shown in FIG. 1U, an $N_2O$ plasma treatment is performed on the third cap insulating layer 49 within a CVD apparatus, in order to dehydrate the cap insulating layer 49 and nitride the surface thereof, thereby prevent the layer from readsorbing moisture. This $N_2O$ plasma treatment is performed on the condition of, for example, a substrate temperature of 350° C. and a treating time of 2 minutes.

Figure 1V:
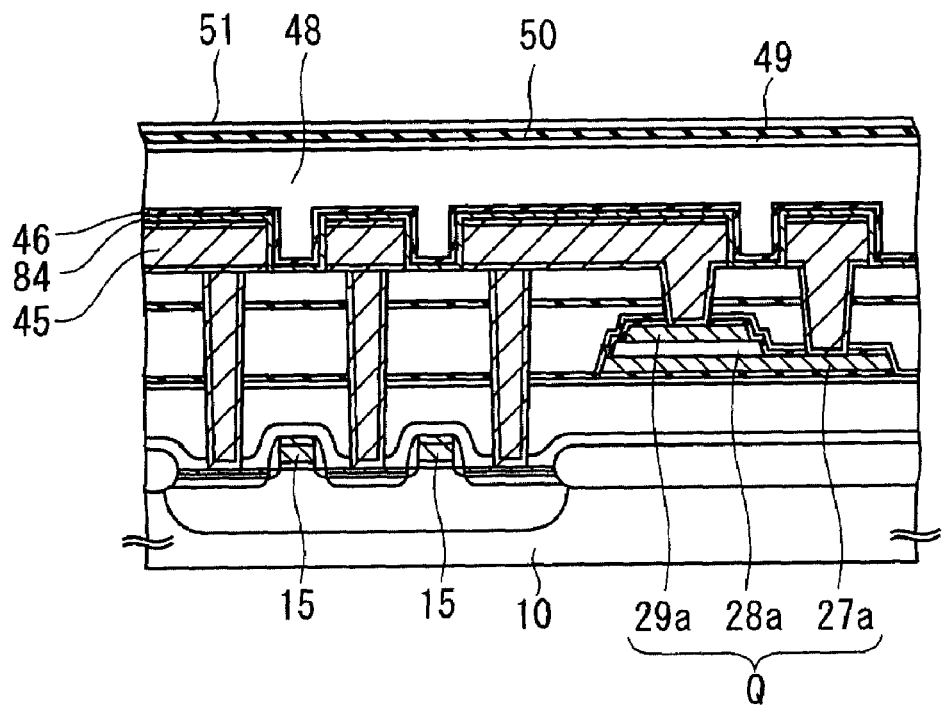

Next, as shown in FIG. 1V, an alumina film is formed on the third cap insulating layer 49 to a thickness of, for example, approximately 20 nm, in order to obtain a fifth capacitor protection insulating film 50. The fifth capacitor protection insulating film 50 assumes the role of preventing reducing substances, such as hydrogen and moisture, from entering the capacitor dielectric film 28a and causing the film to deteriorate.

Note that instead of forming the alumina film, either one of a titanium oxide film, a zirconium oxide film, a magnesium oxide film, and a titanium magnesium oxide film may be formed as the fifth capacitor protection insulating film 50. Then, a silicon dioxide film is formed on the fifth capacitor protection insulating film 50 to a thickness of, for example, approximately 100 nm as a cover insulating film 51, using a plasma CVD method making use of a TEOS gas.

Figure 1W:
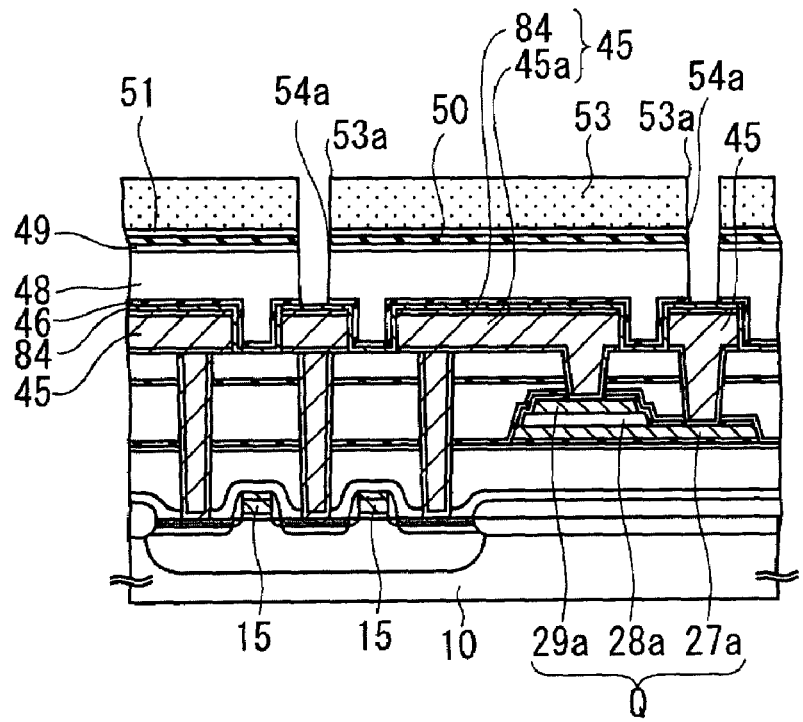

Next, as shown in FIG. 1W, a photoresist is applied onto the cover insulating film 51. Then, the photoresist is exposed and developed to form a third resist pattern 53 provided with hole-shaped windows 53a on the first metal wirings 45.

Then, openings (third via holes 54a) are formed on the cover insulating film 51, the fifth capacitor protection insulating film 50, the third cap insulating layer 49, the second interlayer insulating film 48 and the fourth capacitor protection insulating film 46 below the windows 53a by means of dry etching using a mixed gas composed of $C_4F_8$, Ar and $O_2$. The third via holes 54a are formed above the first metal wirings 45.

At this time, the metal protection film 84 is exposed to a plasma during overetching when forming the third via holes 54a since the first metal wirings 45 are provided with the metal protection film 84 made of a precious metal on the uppermost layers of the upper and side surfaces thereof. However, since precious metals (such as gold and silver) are less reactive to a fluorine-based gas, products of a reaction between a precious metal and a fluorine-based gas are less likely to occur. Consequently, foreign substances are hardly produced in the third via holes 54a. That is, since the TiN film is not exposed to a plasma of a fluorine-based gas during overetching when forming the third via holes 54a, the possibility of any foreign substances being produced decreases dramatically. Accordingly, it is possible to improve the yield and reliability of multilayer interconnections.

Next, the third resist pattern 53 is removed by means of dry ashing. After that, the third resist pattern 53 is post-processed using an organic stripping liquid containing ammonia fluoride (or a hydroxylamine-based stripping liquid).

Figure 1X:
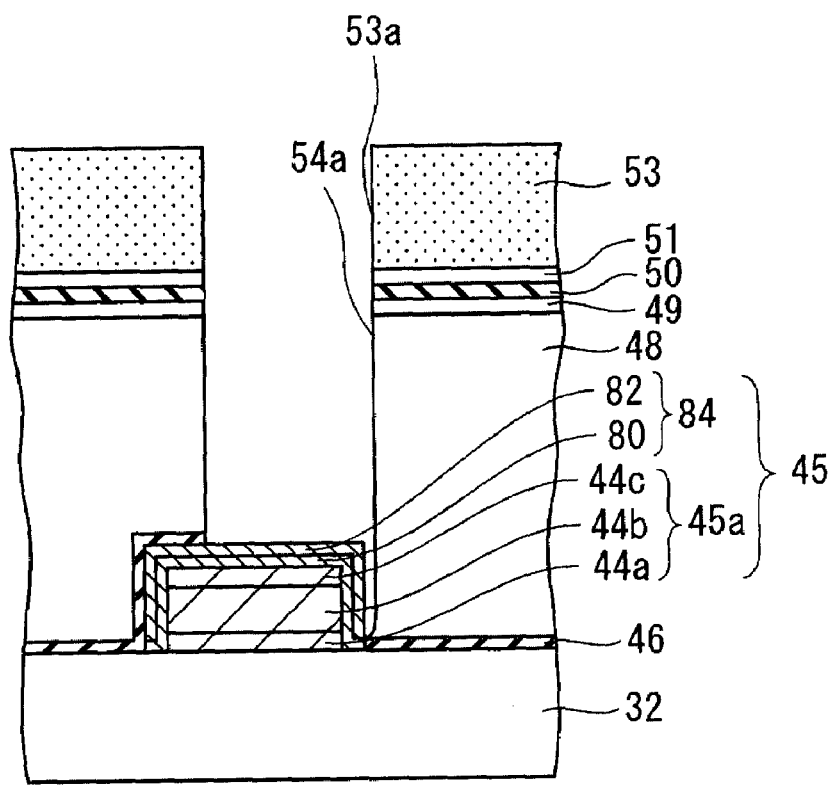

Also note that as shown in FIG. 1X, there is the case that some of the third via holes 54a are formed out of alignment from the upper surfaces of the first metal wirings 45 due to displacement in photolithography or the like. In such a case, the side surfaces of the first metal wirings 45 become exposed within the third via holes 54a. If, unlike the present embodiment, the first metal wirings 45 are not provided with the metal protection film 84, then the Al alloy films 44b may in some cases be etched in the above-described post-processing using an organic stripping liquid. In addition, a Ti film and a $WF_6$ gas may react with each other when loading later-described tungsten plugs into the third via holes 54a, thereby causing a failure of plug formation. Both of these cases can be a cause for degradation in the yield of multilayer interconnections.

On the other hand, in the present embodiment, the Al alloy films 44b and the Ti/TiN films 44c are not exposed within the third via holes 54a since the metal protection film 84 containing a precious metal is also formed on the side surfaces of the first metal wirings 45. Consequently, such a problem due to post-processing as described above does not occur in the present embodiment and it is possible to improve the reliability of multilayer interconnections.

In addition, in the case of FIG. 13C described above, i.e., if using the first metal wirings 45 wherein the metal protection film 84 is formed only on the upper surfaces of the main wiring portions 45a and the sidewall spacers 88 (silicon nitride films) are formed on the side surfaces thereof, it is preferable to adopt conditions wherein the etching rate of silicon nitride films is low (for example, a $C_4F_8/O_2/Ar/O_2+$ CO-based gas is used) as the dry etching conditions for forming the third via holes 54a, for example. As a result, even if the third via holes 54a are formed while being displaced, sidewall spacers 88 (silicon nitride films) function as etching stopper films, thus rendering it possible to prevent the side surfaces of the first metal wirings 45 from becoming exposed.

Figure 1Y:
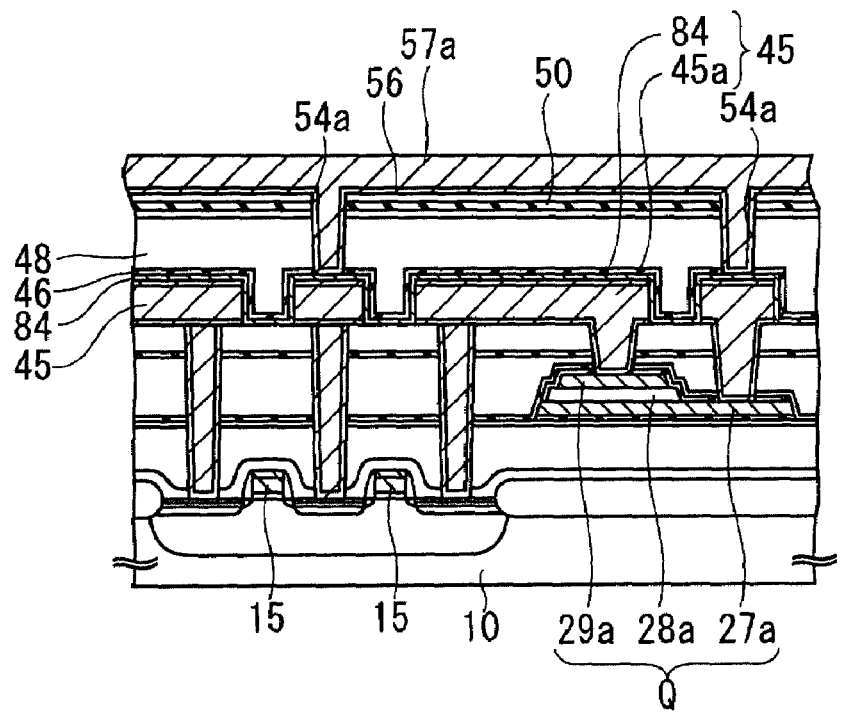

Next, as shown in FIG. 1Y, a titanium nitride film (first glue film 56) is formed on the inner surfaces of the third via holes 54a and on the upper surface of the cover insulating film 51 using a sputtering method, while maintaining the substrate temperature at approximately 200° C. As the film-forming conditions, the substrate temperature is maintained at approximately 200° C. and the thickness of the titanium nitride film thus formed is specified as, for example, approximately 150 nm.

Then, a tungsten film 57a having such a thickness, for example, approximately 650 nm as to completely fill the third via holes 54a is formed on this first glue film 56 using a plasma CVD method making use of tungsten hexafluoride ($WF_6$).

Figure 1Z:
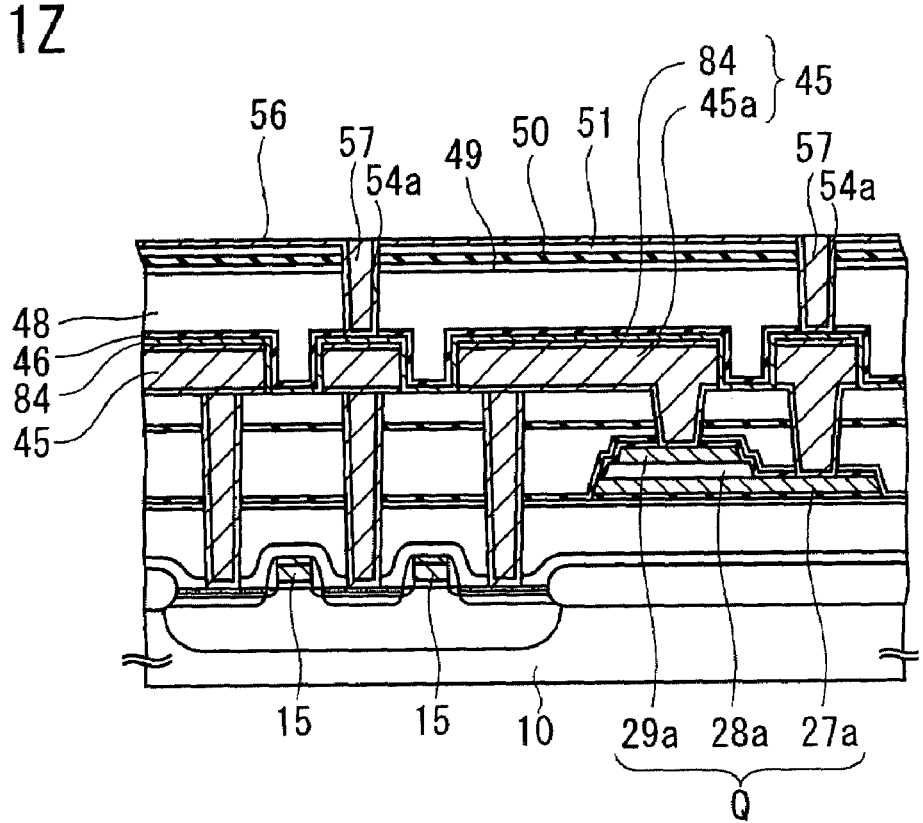
Figure 1A:
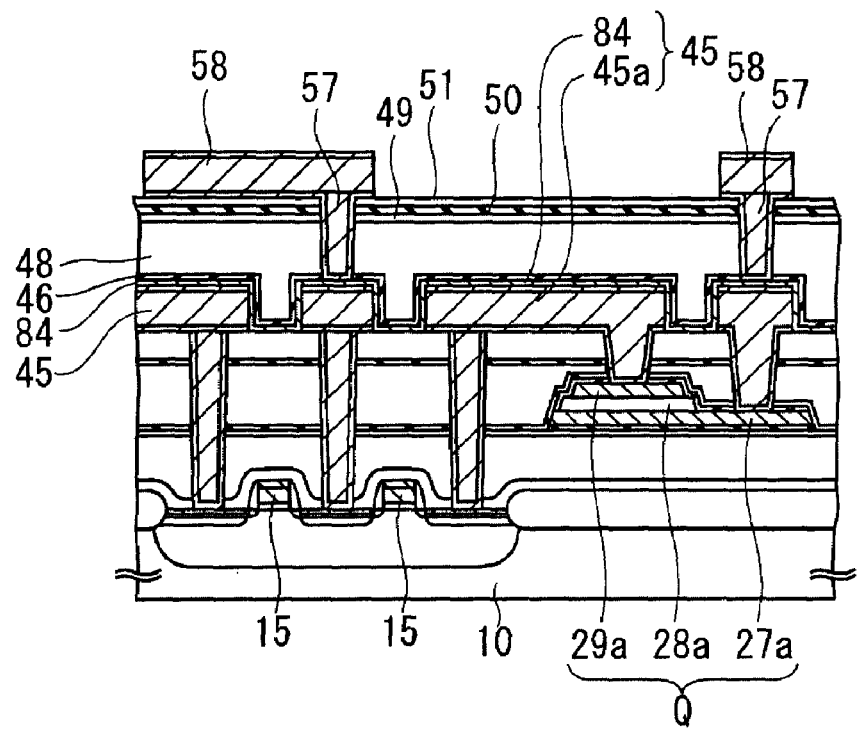
Figure 1A:
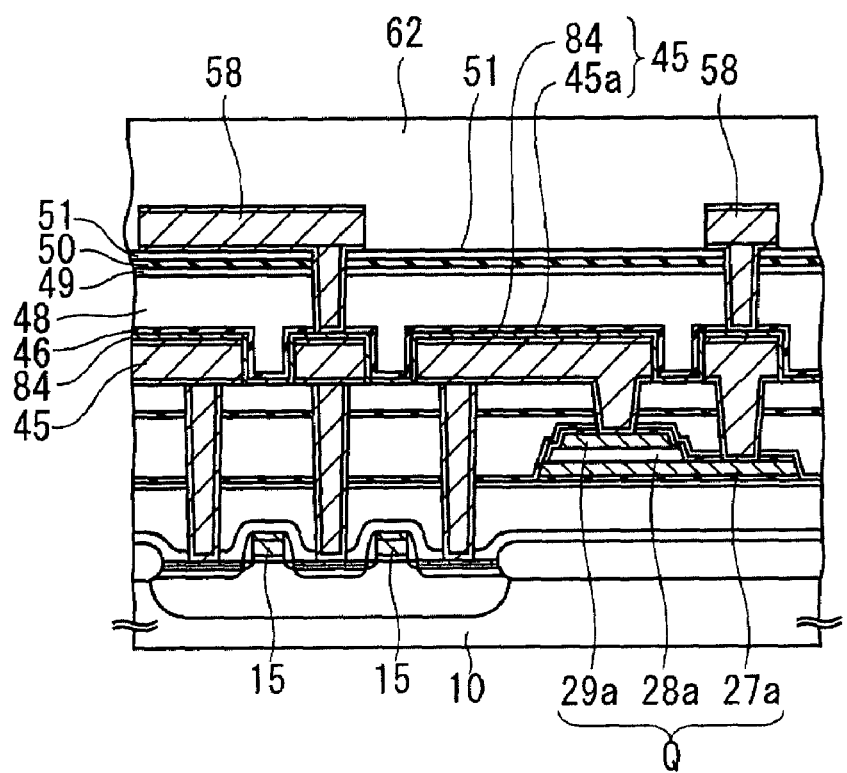
Figure 1A:
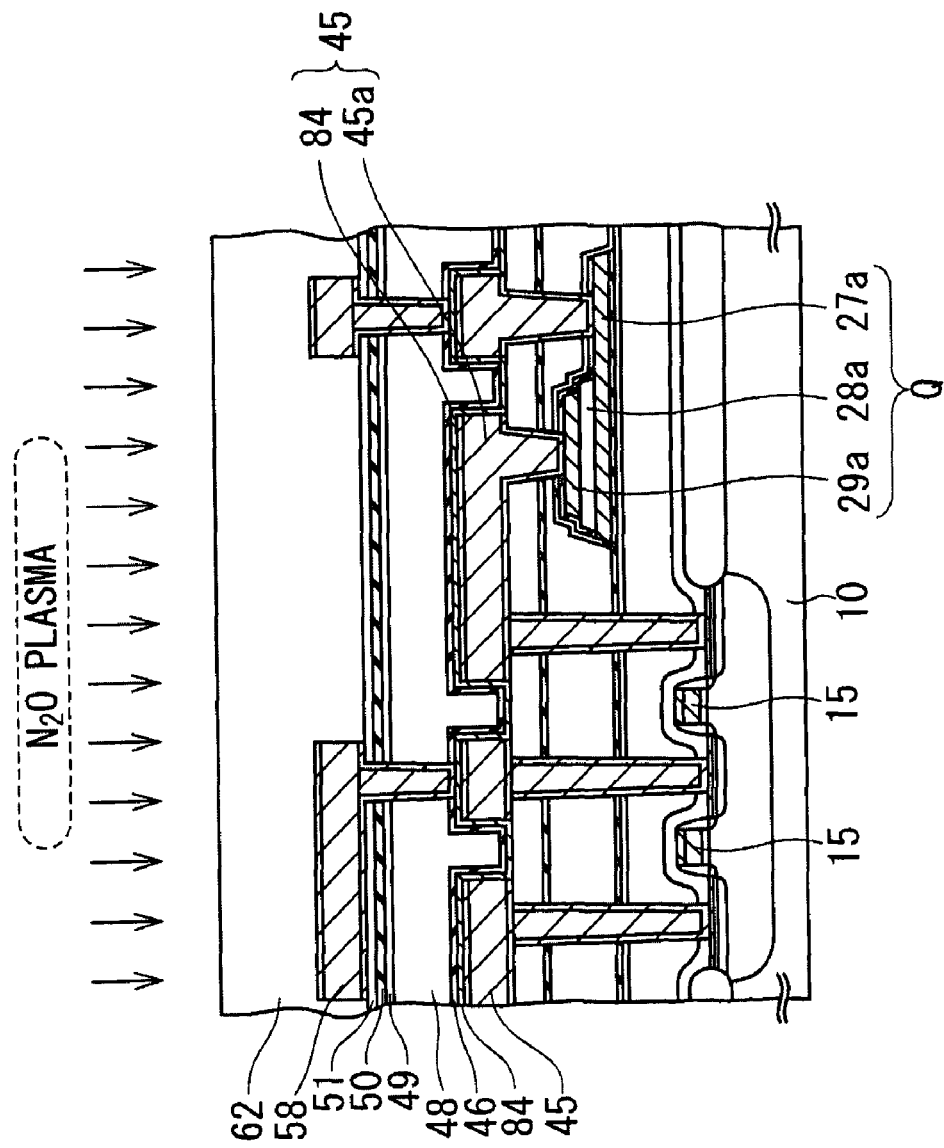
Figure 1A:
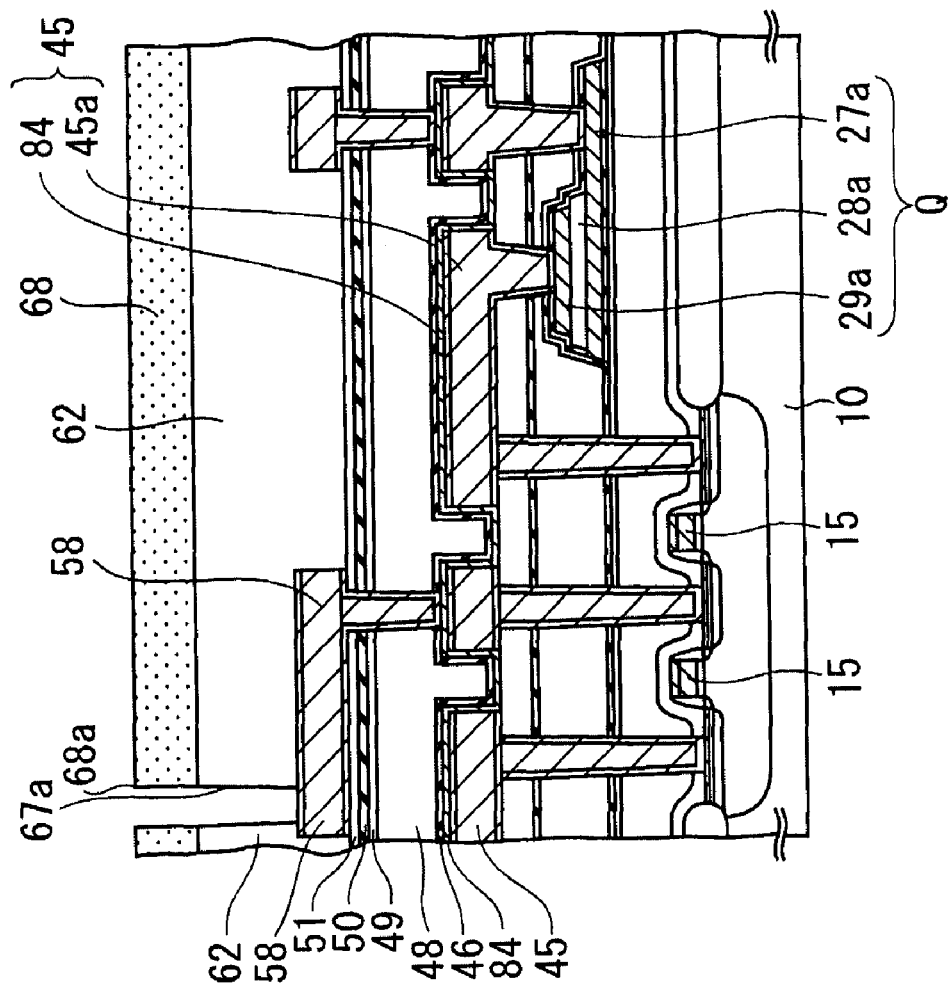
Figure 1A:
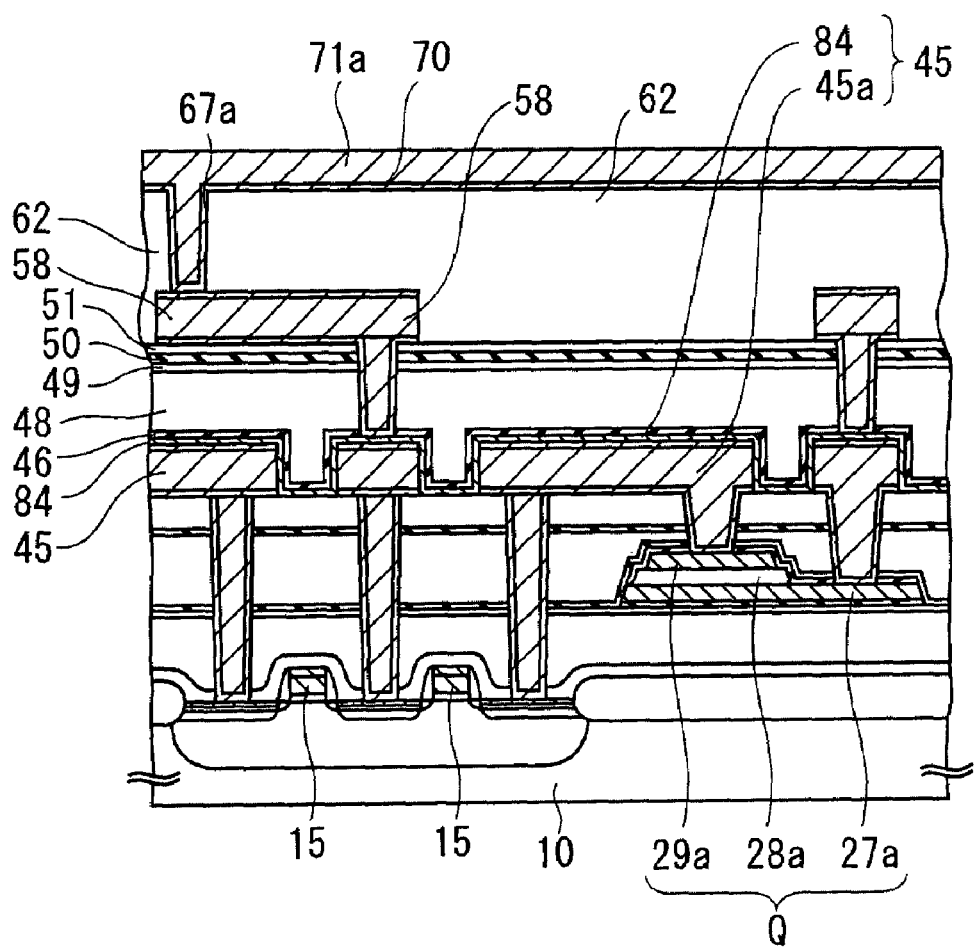
Figure 1A:
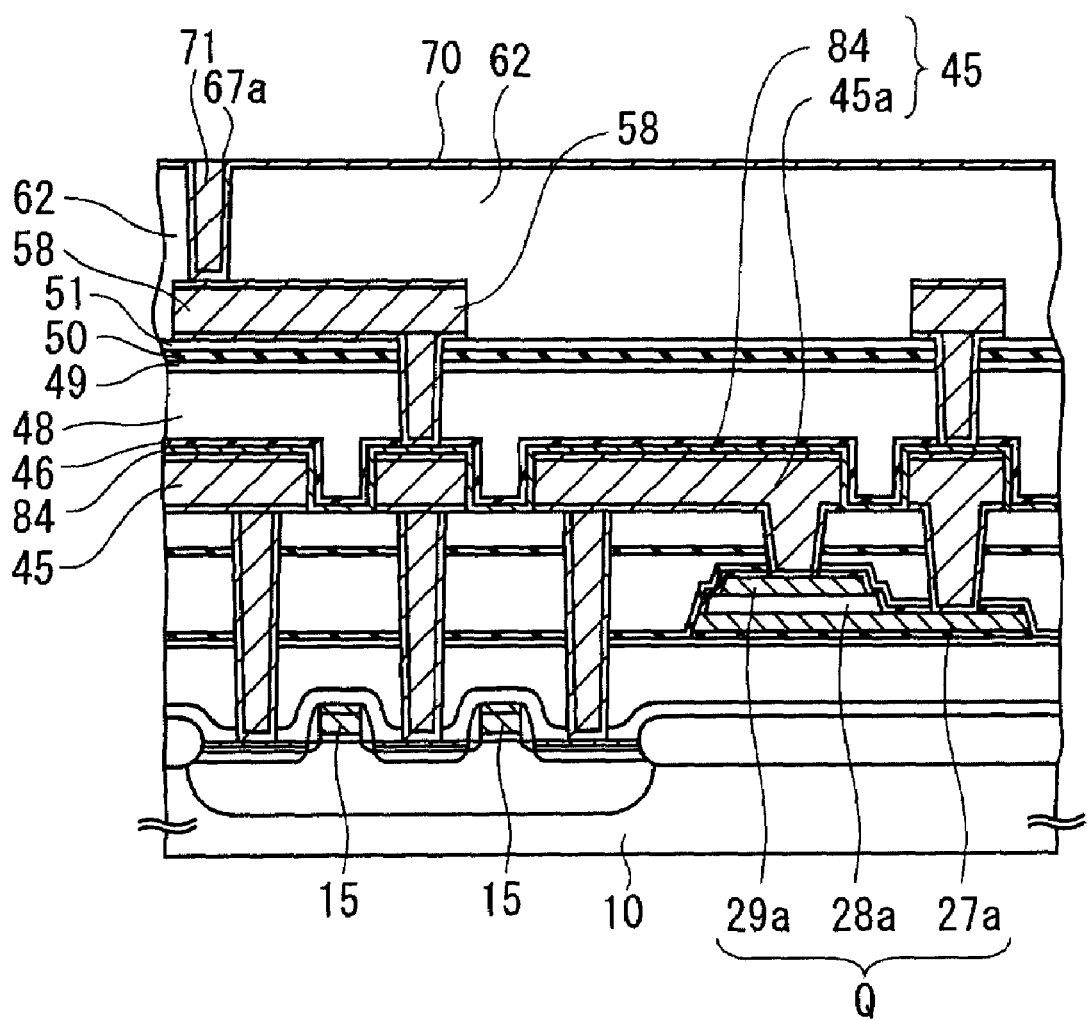
Figure 1A:
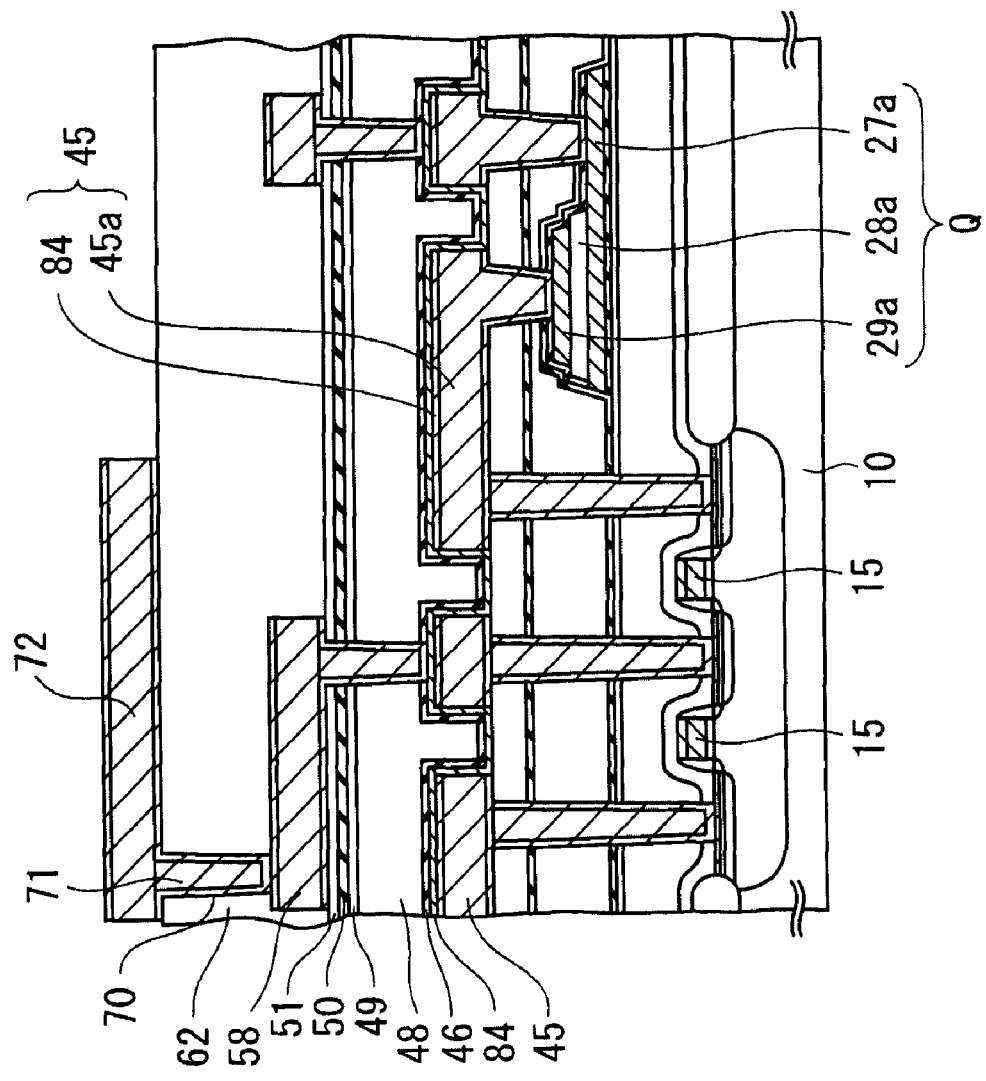

Next, as shown in FIG. 1Z, the abovementioned tungsten film 57a is etched back and removed from the upper surface of the cover insulating film 51, thus leaving the tungsten film 57a only within the third via holes 54a. As a result, there are formed fifth conductive plugs 57 electrically connected to the first metal wirings 45 and composed primarily of tungsten within the third via holes 54a.

Note that although the tungsten film is etched back in this example, CMP may be adopted instead to remove the film.

As described above, no reactions occur between the Ti film and the $WF_6$ gas even if the side surfaces of first metal wirings 45 are exposed within the third via holes 54a, since the metal protection film 84 is formed also on the side surfaces of the first metal wirings 45. Thus, the fifth conductive plugs 57 are formed with a high level of reliability.

Next, an explanation will be made of steps taken until the cross-section structure shown in FIG. 1AA is obtained.

First, a metal laminated film is formed on the respective upper surfaces of the abovementioned fifth conductive plugs 57 and the first glue film 56 using a sputtering method. The metal laminated film is composed of, for example, an approximately 550 nm thick copper-containing aluminum film, an approximately 5 nm thick titanium film, and an approximately 150 nm thick titanium nitride film in sequence from the bottom.

After that, this metal laminated film and the first glue film 56 are patterned by means of photolithography. Next, there are formed second metal wirings 58 (upper metal wirings) composed of these films on the cover insulating film 51.

In this patterning, overetching is applied to etch the abovementioned metal laminated film and the first glue film 56, in order not to leave any etching residual films on the cover insulating film 51.

Even if overetching is applied in this way, the fifth capacitor protection insulating film 50 is still covered with the cover insulating film 51. Accordingly, the fifth capacitor protection insulating film 50 is prevented from being etched and thereby reduced at the time of the above-described patterning. As a result, it is possible to maintain the fifth capacitor protection insulating film 50 at an adequate thickness even after the completion of the patterning. Thus, it is possible to effectively block reducing substances, such as hydrogen, by the fifth capacitor protection insulating film 50.

Note that, as necessary, the second metal wirings 58 may also be covered with the metal protection film 84 the same as that used for the above-described first metal wirings 45.

Then, as shown in FIG. 1AB, a silicon dioxide film is formed on the cover insulating film 51 and the second metal wirings 58, respectively, using a plasma CVD method. A mixed gas composed of a TEOS gas and oxygen is used in the plasma CVD method, and the abovementioned silicon dioxide film is formed to a thickness of, for example, approximately 2200 nm. Note that this silicon dioxide film is defined as a third interlayer insulating film 62.

After that, the upper surface of the third interlayer insulating film 62 is polished and planarized by means of CMP.

Then, as shown in FIG. 1AC, an $N_2O$ plasma treatment is performed on the third interlayer insulating film 62 on the condition of a substrate temperature of 350° C. and a treating time of 4 minutes. Then, this third interlayer insulating film 62 is dehydrated and the surface thereof is nitrided to prevent the film from readsorbing moisture. This $N_2O$ plasma treatment is performed using, for example, a CVD apparatus.

Next, an explanation will be made of steps taken until the cross-section structure shown in FIG. 1AD is obtained.

First, a photoresist is applied onto the third interlayer insulating film 62. Next, the photoresist is exposed and developed to form a fourth resist pattern 68 provided with hole-shaped windows 68a on the second metal wirings 58.

Then, the third interlayer insulating film 62 is dry-etched using the fourth resist pattern 68 as a mask, in order to form fourth via holes 67a in the third interlayer insulating film on the second metal wirings 58. In this etching, a mixed gas composed of $C_4F_8$, Ar, and $O_2$+CO is used, for example, as an etching gas.

After the completion of this etching, the fourth resist pattern 68 is removed.

Then, as shown in FIG. 1AE, a titanium nitride film is formed as a second glue film 70 on the inner surfaces of the fourth via hole 67a and on the upper surface of the third interlayer insulating film 62 to a thickness of, for example, approximately 50 nm, using a sputtering method. Then, a tungsten film 71a is formed on the second glue film 70 using a CVD method, so as to completely fill the fourth via hole 67a with this tungsten film 71a. This tungsten film 71a is formed to a thickness of, for example, approximately 650 nm.

Next, as shown in FIG. 1AF, superfluous parts of the tungsten film 71a on the third interlayer insulating film 62 are etched back and removed, so as to leave over the tungsten film 71a only within the fourth via hole 67a as a sixth conductive plug 71. Note that the tungsten film 71a may be removed using a CMP method instead of etching back the film.

Next, an explanation will be made of steps taken until the cross-section structure shown in FIG. 1AG is obtained.

First, approximately 500 nm thick copper-containing aluminum film and approximately 150 nm thick titanium nitride film, for example, are formed in this order from the bottom on the respective upper surfaces of the second glue film 70 and the sixth conductive plug 71, using a sputtering method. Then, this metal laminated film and the second glue film 70 thereunder are patterned by means of photolithography to form a third metal wiring 72.

Next, an explanation will be made of steps taken until the cross-section structure shown in FIG. 1AH is obtained.

First, a silicon dioxide film is formed as a first passivation film 75 on the third interlayer insulating film 62 and the third metal wiring 72, respectively, to a thickness of approximately 100 nm, using a CVD method.

Note that an $N_2O$ plasma treatment for the purpose of dehydration and prevention against moisture adsorption may be performed on the first passivation film 75. This $N_2O$ plasma treatment is performed, for example, within a CVD apparatus on the condition of a substrate temperature of 350° C. and a treating time of 2 minutes.

In addition, an approximately 350 nm thick silicon nitride film is formed on this first passivation film 75 as a second passivation film 76 using a CVD method.

Then, these first passivation film 75 and second passivation film 76 are patterned to form openings (not shown in the figure) wherein bonding pads (not shown in the figure) in the pad region of the third metal wiring 72 are exposed.

Next, a photosensitive polyimide film, for example, is formed on the entire upper surface of the silicon substrate 10 to a thickness of approximately 3 μm, in order to form a protection layer 77 composed of a polyimide coating film. Next, the protection layer 77 is exposed and developed to form openings (not shown in the figure) therein in which bonding pads are exposed. After that, the protection layer 77 is thermally hardened on the condition of a substrate temperature of 310° C., an $N_2$ flow rate of 100 liter/min, and a treating time of 40 minutes.

As a result, the semiconductor device of the present embodiment is completed.

As heretofore described, in the present embodiment, since metal wirings composed of main wiring portions laminated with a plurality of metal films and a metal protection film formed at least on the upper surface of the main wiring portions and made of a precious metal material are used as wirings, it is possible to inhibit a reaction between an etchant and the metal wirings when forming via holes in an interlayer insulating film on the metal wirings, thereby dramatically reducing the possibility of foreign substances (reaction products) being produced. In addition, it is possible to prevent the metal wirings from being damaged when forming the via holes.

Furthermore, it is also possible to improve the reliability of the metal wirings by adopting a metal protection film composed of a precious metal film since a precious metal has both a low electrical resistance and a stress-relaxing effect.

As described above, in the present embodiment, such problems in the contacts of multilayer interconnections as an open-circuit failure or a resistance rise are solved, thereby rendering it possible to reliably form the multilayer interconnections with a high yield.

In addition, it is possible to increase wiring strength by adopting metal wirings provided with a precious metal film. Accordingly, by using a precious metal film made of a metal other than gold or silver in particular, it is possible to prevent the capacitors of an FeRAM from deteriorating due to a stress.

While in the present embodiment, the description has been made of examples wherein the wiring structure in accordance with the present invention is applied to an FeRAM, the wiring structure is also applicable to other various types of electronic devices, including logic LSIs and memory LSIs.

What is claimed is:

1. A semiconductor device comprising:
a semiconductor substrate;
an insulating film formed over the semiconductor substrate;
a metal wiring formed on the insulating film and having a main wiring portion laminated with a plurality of metal films and a metal protection film, the metal protection film covering upper and side surfaces of the main wiring portion and being composed of a plating power-supply film and a precious metal film;
an interlayer insulating film formed on the metal wiring and having a via hole reaching to the metal wiring.

2. The semiconductor device according to claim 1,
wherein the plurality of metal films have a structure in which a cap metal film is formed on a metal pattern film.

3. The semiconductor device according to claim 2,
wherein the cap metal film is a metal nitride film or a metal silicide film.

4. The semiconductor device according to claim 1,
wherein sidewalls made of silicon nitride are formed on side surfaces of the main wiring portion.

5. The semiconductor device according to claim 1, further comprising:
a upper metal wiring formed on the interlayer insulating film, wherein the upper metal wiring is electrically connected to the metal wiring through conductive plugs filled in the via hole.

6. A semiconductor device comprising:
a semiconductor substrate;
an insulating film formed over the semiconductor substrate;
a metal wiring formed on the insulating film and having a main wiring portion and a metal protection film, the main wiring portion being laminated with a plurality of metal films and a metal protection film, the metal protection film covering upper and side surfaces of the main wiring portion and being made of a precious metal film; and
an interlayer insulating film formed on the metal wiring and having a via hole reaching to the metal wiring,
wherein a thickness of the metal protection film formed on the upper surfaces of the main wiring portion is greater than a thickness of the metal protection film formed on the side surfaces of the main wiring portion.

7. A semiconductor device comprising:
a semiconductor substrate;
an insulating film formed over the semiconductor substrate;
a metal wiring formed on the insulating film and having a main wiring portion and a metal protection film, the main wiring portion being laminated with a plurality of metal films and a metal protection film, the metal protection film being formed at least on upper surfaces of the main wiring portion and being made of a precious metal film; and
an interlayer insulating film formed on the metal wiring and having a via hole reaching to the metal wiring,
wherein the interlayer insulating film is formed inclusive of an alumina film and the metal wiring is electrically connected to a ferroelectric capacitor provided over the semiconductor substrate.

* * * * *